United States Patent [19]
Nguyen et al.

[11] Patent Number: 5,844,425
[45] Date of Patent: Dec. 1, 1998

[54] CMOS TRISTATE OUTPUT BUFFER WITH HAVING OVERVOLTAGE PROTECTION AND INCREASED STABILITY AGAINST BUS VOLTAGE VARIATIONS

[75] Inventors: Hung T. Nguyen, San Jose; Chit Ah Mak, Fremont, both of Calif.; Steve W. T. Liu, Homebush, Australia

[73] Assignee: Quality Semiconductor, Inc., Santa Clara, Calif.

[21] Appl. No.: 694,712

[22] Filed: Jul. 19, 1996

[51] Int. Cl.$^6$ .................................................. H03K 19/00
[52] U.S. Cl. .............................. 326/58; 326/81; 326/86; 365/185.05; 365/189.09
[58] Field of Search .................................. 326/58, 81, 83, 326/86; 327/534, 535; 365/189.05, 189.09, 189.11

[56] References Cited

U.S. PATENT DOCUMENTS

| | | |
|---|---|---|
| 4,217,502 | 8/1980 | Suzulkio et al. . |
| 4,581,551 | 4/1986 | Campbell, Jr. . |
| 4,678,950 | 7/1987 | Mitake . |
| 4,709,162 | 11/1987 | Braceras et al. . |
| 4,782,250 | 11/1988 | Adams et al. . |
| 4,963,766 | 10/1990 | Lundberg . |
| 4,985,646 | 1/1991 | Kumagai et al. . |
| 5,003,205 | 3/1991 | Kohda et al. . |
| 5,083,048 | 1/1992 | Kashimura . |
| 5,097,152 | 3/1992 | Kohda et al. . |
| 5,118,974 | 6/1992 | Yarbrough et al. . |
| 5,124,585 | 6/1992 | Kim et al. . |
| 5,144,165 | 9/1992 | Dhong et al. . |
| 5,151,619 | 9/1992 | Austin et al. . |
| 5,153,457 | 10/1992 | Martin et al. . |
| 5,159,216 | 10/1992 | Taylor et al. . |
| 5,160,855 | 11/1992 | Dobberpuhl . |
| 5,172,016 | 12/1992 | Dobberpuhl . |
| 5,179,299 | 1/1993 | Tipon . |
| 5,191,244 | 3/1993 | Runaldue et al. . |
| 5,266,849 | 11/1993 | Kitahara et al. . |
| 5,270,588 | 12/1993 | Choi . |
| 5,270,589 | 12/1993 | Sawada . |
| 5,274,276 | 12/1993 | Casper . |
| 5,276,364 | 1/1994 | Wellheuser . |
| 5,300,832 | 4/1994 | Rogers . |
| 5,300,835 | 4/1994 | Assar et al. . |
| 5,311,076 | 5/1994 | Part et al. . |
| 5,321,319 | 6/1994 | Mahmood . |
| 5,338,978 | 8/1994 | Larsen et al. . |
| 5,381,059 | 1/1995 | Douglas . |
| 5,381,061 | 1/1995 | Davis . |
| 5,381,062 | 1/1995 | Morris . |
| 5,396,128 | 3/1995 | Dunning et al. . |
| 5,406,140 | 4/1995 | Wert et al. . |
| 5,410,267 | 4/1995 | Haycock et al. . |
| 5,418,476 | 5/1995 | Strauss . |
| 5,424,659 | 6/1995 | Stephens et al. . |
| 5,436,585 | 7/1995 | DiMarco . |
| 5,440,244 | 8/1995 | Richter et al. . |
| 5,442,307 | 8/1995 | Shigehara et al. . |
| 5,444,397 | 8/1995 | Wong et al. . |
| 5,446,321 | 8/1995 | Yoshino et al. . |
| 5,448,198 | 9/1995 | Toyoshima et al. . |
| 5,450,025 | 9/1995 | Shay . |
| 5,451,889 | 9/1995 | Heim et al. . |
| 5,455,732 | 10/1995 | Davis . |
| 5,467,031 | 11/1995 | Nguyen et al. . |
| 5,500,817 | 3/1996 | McLaury . |
| 5,661,414 | 8/1997 | Shigehara et al. .......... 326/81 |

*Primary Examiner*—David C. Nelms
*Assistant Examiner*—Hoai Ho
*Attorney, Agent, or Firm*—Pennie & Edmonds LLP

[57] ABSTRACT

An overvoltage tolerant CMOS tristate output buffer capable of withstanding tristate overvoltages without reverse currents or latch-up, the output buffer having a stabilized protection circuit for driving the N-well and gate of the P-channel driver transistor to the output pad voltage when the output pad voltage becomes excessive. The stabilized protection circuit includes a hysteresis circuit for controlling switch transistors which bias the N-well. The presence of the hysteresis circuit causes the protection circuit to have an input hysteresis characteristic, thus preventing excessive switching of the N-well biasing transistors when the output pad voltage varies near the output buffer power supply voltage during tristate.

49 Claims, 12 Drawing Sheets

CMOS TRISTATE OUTPUT BUFFER WITH HAVING OVERVOLTAGE PROTECTION AND INCREASED STABILITY AGAINST BUS VOLTAGE VARIATIONS

FIELD OF THE INVENTION

The present invention relates to the field of tristate output buffers. In particular, the present invention relates to the field of CMOS tristate output buffers capable of tolerating overvoltages during tristate mode without reverse currents or latch-up.

BACKGROUND OF THE INVENTION

Advances in integrated circuit fabrication technology continue to enable greater numbers of CMOS logic devices to be formed on a single integrated circuit chip. One change which has been found necessary to implement the higher density CMOS devices has been to reduce the power supply voltage driving the chip. For example, a power supply voltage VDD of 3.3 volts is common in present state of the art CMOS logic devices.

Low voltage CMOS memory devices must often be operatively interconnected with external 5-volt devices such as TTL devices. Generally, a 3.3 volt CMOS device is capable of driving 5-volt TTL devices attached to a data bus, provided that the CMOS device can generate sufficient current at its output pad. Such CMOS devices are usually provided with a tristate output buffer having a large P-channel driver transistor capable of providing sufficient current at the output pad at 3.3 volts. The tristate output buffer is also provided with a relatively large N-channel pulldown transistor capable of sinking sufficient current to drive the data bus to zero volts in a timely manner. During tristate or high impedance mode, the tristate output buffer causes the CMOS device to appear transparent to the line or output terminal to which it is connected. This is achieved by turning off both the P-channel driver transistor and the N-channel pulldown transistor so that a high input impedance is seen at the output pad.

FIG. 1 shows a standard CMOS tristate output buffer 100 according to the prior art. Tristate output buffer 100 comprises a P-channel driver transistor P1, an N-channel pulldown transistor N1, and predriver circuitry 101. P-channel driver transistor P1 comprises a gate coupled to a node VP, while N-channel pulldown transistor N1 comprises a gate coupled to a node VN. Predriver circuitry 101 is coupled to nodes VP and VN as shown in FIG. 1. Tristate output buffer 100 further comprises a node OE for receiving an output enable signal, as well as a node D for receiving a data signal. The signals at nodes OE and D are typically provided by low-voltage CMOS core logic circuitry (not shown). Tristate output buffer 100 also comprises an output node VPAD for coupling to an external data bus (not shown), to which various external devices, such as TTL devices or other CMOS devices, are connected. Tristate output buffer 100 comprises a node VDD for receiving a standard CMOS power supply voltage, such as 3.3 volts, at the source of P-channel driver transistor P1. Finally, tristate output buffer 100 comprises a node GND for receiving a ground voltage. For simplicity and clarity of disclosure, "VDD" will represent both the node VDD and the power supply voltage provided at node VDD. Likewise, "GND" or "ground" will represent both the node GND and the ground voltage provided at node GND.

As is well known in the art, tristate output buffer 100 is designed to drive a voltage at node VPAD according to the logic values represented by the voltages at nodes OE and D. When OE is high, the term "high" usually signifying a voltage above a low-voltage CMOS logic threshold, the tristate output buffer is in a "drive" or "output enable" mode. Thus, when OE is high and D is high, the voltage at node VPAD is driven to VDD. When OE is high and D is low, the term "low" usually signifying a voltage below the low-voltage CMOS logic threshold, the voltage at node VPAD is driven to ground.

In contrast, when OE is low, the tristate output buffer is in a "tristate" or "high impedance" mode. Tristate mode occurs when the low voltage CMOS core logic circuitry associated with the tristate output buffer 100 is not driving the bus. Instead, the low-voltage CMOS core logic circuitry is either (1) receiving data from the bus at node VPAD (using input circuitry not shown) or (2) is not involved in any transactions occurring on the bus. In this circumstance, it is desired for the tristate output buffer 100 to have a high input impedance for avoiding unnecessary current sinks and for reducing overall bus inductance and capacitance. The voltage at node D does not affect the voltage at node VPAD when OE is low.

In conventional CMOS integrated circuits, large N-wells are formed on p-type substrates, and PMOS transistors are formed in these N-wells. Typically, all of the P-channel transistors of the tristate output buffer 100 are formed in a common N-well and have substrate or terminals that are electrically integral with or connected to the N-well. This is not explicitly shown in the present drawings, but is described and illustrated in U.S. Pat. No. 5,338,978, issued Aug. 16, 1994 to Larsen et al., entitled FULL SWING POWER DOWN BUFFER CIRCUIT WITH MULTIPLE POWER SUPPLY ISOLATION, the disclosure of which is incorporated herein by reference.

Several problems can occur when the tristate output buffer 100 of FIG. 1 is used to drive a data bus which can be driven to high voltages (5.0 v) by other devices such as TTL devices. Specifically, the following problems can occur when the voltage at node VPAD exceeds the N-well voltage during tristate mode. First, a reverse leakage current through the P-channel driver transistor P1, from node VPAD to VDD, may occur due to a forward biasing of the drain of transistor P1 with respect to its gate. Second, latch-up may occur in a parasitic silicon controlled rectifier formed by (1) a parasitic PNP transistor having the p+ drain of P1 as its emitter, the N-well as its base, and the p-substrate as its collector, and (2) a parasitic NPN transistor having the n+ body terminal of P1 as its collector, the p-substrate as its base, and a neighboring n+ terminal as its emitter. Third, excessively high stress voltages may occur across the gate oxides of various buffer transistors, including the P-channel driver transistor P1. These problems are discussed more fully in U.S. Pat. No. 5,444,397, issued Aug. 22, 1995 to Wong et al., titled ALL-CMOS HIGH-IMPEDANCE OUTPUT BUFFER FOR A BUS DRIVEN BY MULTIPLE POWER-SUPPLY VOLTAGES, the disclosure of which is incorporated herein by reference.

FIG. 2 shows an exemplary circuit known in the art for resolving at least some of these problems. FIG. 2 shows a tristate output buffer 200 similar to that shown in FIG. 1, with the addition of an N-well bias circuit 204 and a gate bias circuit 206. The purpose of the elements 204 and 206 is to implement feedback circuits causing the N-well and gate of the P-channel driver transistor P1 to follow the voltage at node VPAD during tristate mode when this voltage exceeds VDD. If VPAD does not exceed VDD during tristate mode, the N-well and gate voltages are maintained at VDD. In this manner, the drain of transistor P1 does not become forward biased with respect to its gate or the N-well, thus eliminating reverse leakage current. Furthermore, because the gate bias circuit 206 generally biases gate node VP to a voltage substantially equal to the voltage at which N-well bias circuit 204 biases the N-well, excessive oxide stresses are reduced.

Examples of tristate buffer circuits incorporating elements analogous to element 204, element 206, or both, are disclosed in U.S. Pat. No. 5,160,855, issued Nov. 3, 1992 to Dobberpuhl, titled FLOATING-WELL CMOS OUTPUT DRIVER, U.S. Pat. No. 5,467,031, issued Nov. 14, 1995 to Nguyen et al., titled 3.3 VOLT CMOS TRI-STATE DRIVER CIRCUIT CAPABLE OF DRIVING COMMON VOLT LINE, and U.S. Pat. No. 5,396,128, issued Mar. 7, 1995 to Dunning et al., titled OUTPUT CIRCUIT FOR INTERFACING INTEGRATED CIRCUITS HAVING DIFFERENT POWER SUPPLY POTENTIALS, the disclosures of which are incorporated herein by reference.

A problem, however, exists in prior art gate bias and N-well bias circuits in CMOS tristate output buffers. Specifically, the circuits are not stabilized with respect to variations of the voltage at VPAD near VDD during tristate mode. Such a variation may include an unstable high voltage transient occurring on the data bus during tristate mode. In prior art devices, the circuits represented by N-well bias circuit 204 and gate bias circuit 206 will cause an unstable switching of the bias voltages back and forth between nodes VDD and VPAD when VPAD hovers near VDD. This is because the devices include only "combinational" logic, in which the present output (i.e., the bias voltage) is only a function of the present value of VDD with respect to VPAD. For example, as the present value of VPAD crosses over some combinational logic threshold voltage VT* during tristate, the bias circuits will cease coupling the N-well and gate to VDD and will instead couple these nodes to VPAD. As the present value of VPAD crosses back below this same combinational logic threshold voltage VT*, the bias circuits will then switch back from VPAD to VDD.

Driver transistors contained within the N-well bias circuit 204 and/or gate bias circuit 206 need relatively large transistors (although not as large as P-channel driver transistor P1) sufficient to speedily switch the large N-well and gate nodes of P1 between VDD and VPAD. It has been found that it is not desirable to over-switch these bias circuit transistors unnecessarily, such as when a high voltage transient on the data bus occurs near VDD during tristate mode. The negative effects of such over-switching include unnecessary heating and high-frequency system noise.

Another problem which arises in the context of the circuit of FIG. 2 is related to the predriver circuitry 202. Because the P-channel driver transistor P1 is generally large, it is desirable for the predriver circuitry 202 to be capable of driving the gate of transistor P1 with a relatively large driving current at node VP', and hence at node VP, when P-channel driver transistor P1 is to be turned off. It is also desirable for the predriver circuitry 202 to be capable of sinking a relatively large amount of current from node VP', and hence node VP, when P-channel driver transistor is to be turned off.

FIG. 2A shows one way of achieving the large driving and sinking currents for the gate of P-channel predriver transistor P1, which is to drive VP' with a predriver stage inverter comprising a pullup transistor P2 and a pulldown transistor N2. Shown in FIG. 2A is a circuit 202A for generating the signal VN and the appropriate driving signal for driving the gates of transistors P2 and N2. This supplies adequate driving and sinking current when transistors P2 and N2 are appropriately sized.

However, when used in combination with the circuit of FIG. 2, the circuit of FIG. 2A experiences an undesirable reverse current problem. In particular, in the circumstance in which gate bias circuit 206 drives the node VP to VPAD during tristate when VPAD exceeds VDD, node VP' will often be driven to this voltage as well. Using an exemplary value of VDD as 3.3 volts and VPAD being driven to 5.0 volts, there then exists the situation where the gate of transistor P2 is at VDD=3.3 volts, the drain of P2 is at VP'=5.0 volts, and the source of P2 is at 3.3 volts. In this situation, a large and potentially destructive reverse current through transistor P2 can be experienced.

It is therefore an object of the present invention to provide a CMOS tristate output buffer capable of withstanding an overvoltage at its output pad during tristate mode.

It is another object of this invention to provide circuitry for biasing the N-well and gate of the P-channel driver transistor of the CMOS tristate output buffer such that reverse leakage current, latchup, and excessive oxide stresses are avoided during tristate overvoltage conditions.

It is another object of the present invention to provide circuitry which provides high-speed multiplexing of the bias voltage between the output pad voltage and VDD, for biasing the N-well and gate of the P-channel driver transistor to the appropriate values.

It is yet another object of the present invention to provide circuits for biasing the N-well and gate of the P-channel driver transistor with increased stability during tristate mode against variations in the output pad voltage taking place near VDD, including high voltage transients occurring on the data bus.

It is still another object of the present invention to provide a circuit for driving the gate of the P-channel driver transistor with sufficient driving and sinking current, while avoiding reverse currents through predriver stage transistors during tristate overvoltage conditions.

SUMMARY OF THE INVENTION

These and other objects of the present invention are provided for by a CMOS tristate output buffer having an N-well bias circuit with an input hysteresis characteristic. The tristate output buffer has a drive mode, during which the tristate output buffer drives a voltage at an output terminal, and a tristate mode, during which the tristate output buffer represents a high input impedance at the output terminal. The N-well bias circuit biases an N-well of the tristate output buffer such that the voltage at the output pad is applied to the N-well at appropriate times during the tristate mode. The input hysteresis characteristic of the N-well bias circuit reduces unnecessary overswitching in the N-well bias circuit, providing stability against variations of the output terminal voltage near a power supply voltage of the tristate output buffer during tristate mode.

A tristate output buffer according to the present invention has a first power supply node for coupling to a first power supply voltage and a reference node for coupling to a reference voltage. The tristate output buffer drives the output terminal between the first power supply voltage and the reference voltage in the drive mode. The tristate output buffer comprises a P-channel driver transistor coupled between the first power supply node and the output terminal, the P-channel driver transistor being in the N-well. The N-well bias circuit is coupled to the N-well, to the first power supply node, and to the output terminal. The N-well bias circuit provides an N-well bias voltage to the N-well responsive to the voltage at the output terminal relative to the first power supply voltage during tristate mode. The N-well bias circuit has an input hysteresis characteristic for providing N-well bias circuit stability. In one form, the N-well bias circuit includes a hysteresis latch.

In another form, the tristate output buffer comprises a gate bias circuit for biasing the gate of the P-channel driver transistor, the gate bias circuit biasing the gate of the P-channel driver transistor responsive to the voltage at the output terminal relative to the first power supply voltage during tristate mode. The gate bias circuit has an input hysteresis characteristic for providing gate bias circuit stability. In another form, the gate bias circuit includes a hysteresis latch.

In yet another form, the tristate output buffer includes an N-well bias circuit including a high-gain, high-speed multiplexing switch for multiplexing the N-well bias voltage between the output terminal and the first power supply voltage responsive to their relative values during tristate mode. The N-well bias circuit has adequate input hysteresis sufficient to increase circuit stability against output terminal voltage transients occurring near VDD during tristate mode.

In yet another form, a tristate output buffer according to the present invention comprises an N-well bias circuit comprising a comparator for biasing the N-well to the greater of the output terminal voltage and the supply voltage. The tristate output buffer further comprises a gate bias transistor coupled between the N-well and the gate of the P-channel driver transistor for coupling the N-well to the gate of the P-channel driver transistor during tristate mode. The tristate output buffer further comprises a predriver stage, comprising a predriver pullup transistor and a predriver pulldown transistor, for driving the gate of the P-channel driver transistor. A P-channel switch transistor is interposed between the predriver pullup transistor and the gate of the P-channel driver transistor for avoiding reverse currents through the predriver pullup transistor when the voltage at the gate of the P-channel driver transistor rises above the first power supply voltage. A resistive element is interposed between the gate of the P-channel driver transistor and the predriver pulldown transistor. The P-channel switch transistor is driven by a signal generated by an active-mode circuit for quickly turning off the P-channel switch transistor when the output voltage exceeds the first power supply voltage during tristate mode.

In yet another form, the tristate output buffer comprises an N-well bias circuit for biasing the N-well to the greater of the output terminal voltage and the supply voltage during tristate mode, and for biasing the N-well to the first power supply voltage during drive mode. The tristate output buffer further comprises a gate bias transistor coupled between the N-well and the gate of the P-channel driver transistor, a predriver stage comprising a predriver pullup transistor and a predriver pulldown transistor, a P-channel switch transistor interposed between the predriver pullup transistor and the gate of the P-channel driver transistor, a resistive element interposed between the gate of the P-channel driver transistor and the predriver pulldown transistor, and an active-mode circuit for quickly turning off the P-channel switch transistor when the output voltage exceeds the first power supply voltage during tristate mode.

BRIEF DESCRIPTION OF THE DRAWINGS

The above mentioned objects and other objects, features, and advantages of the invention may be better understood by referring to the following detailed description, which should be read in conjunction with the accompanying drawings in which.

DETAILED DESCRIPTION OF THE INVENTION

Figure 1:
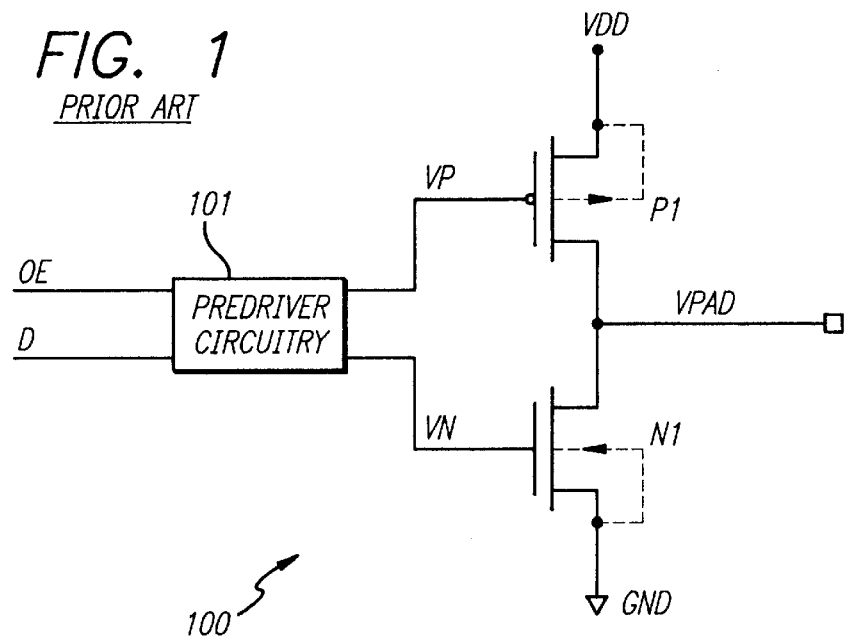
FIG. 1 illustrates a CMOS tristate output buffer according to the prior art.
Figure 2A:
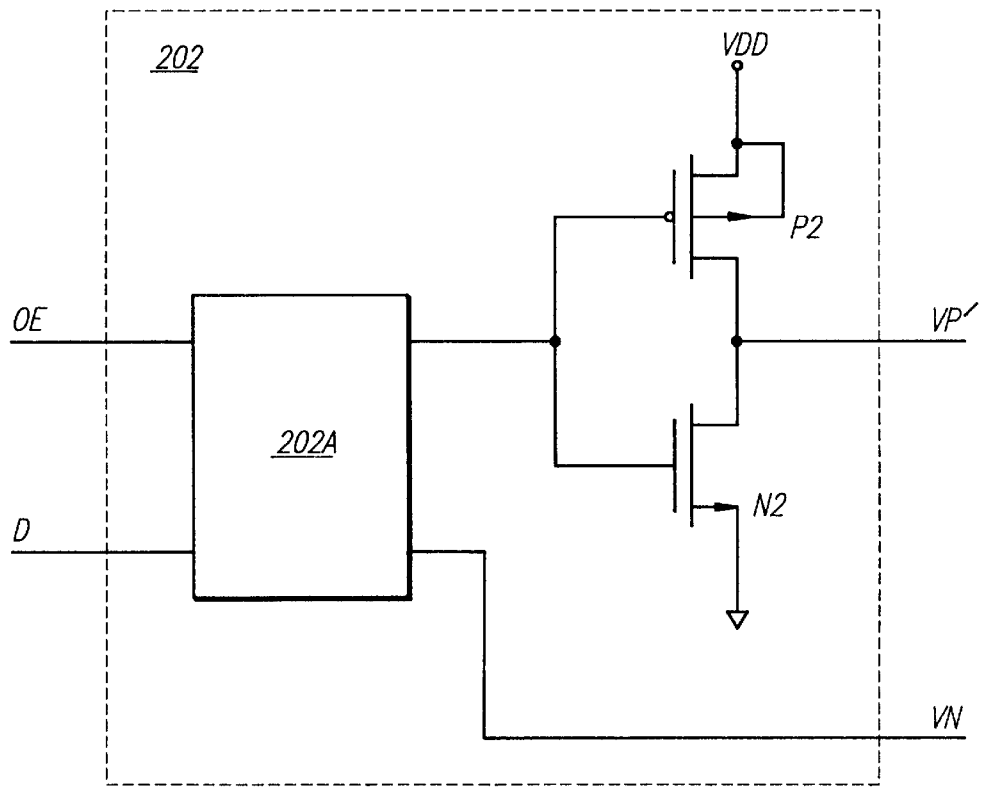
FIGS. 2 and 2A illustrate a block diagram of a CMOS tristate output buffer according to the prior art containing modifications to tolerate tristate mode overvoltages.
Figure 2:
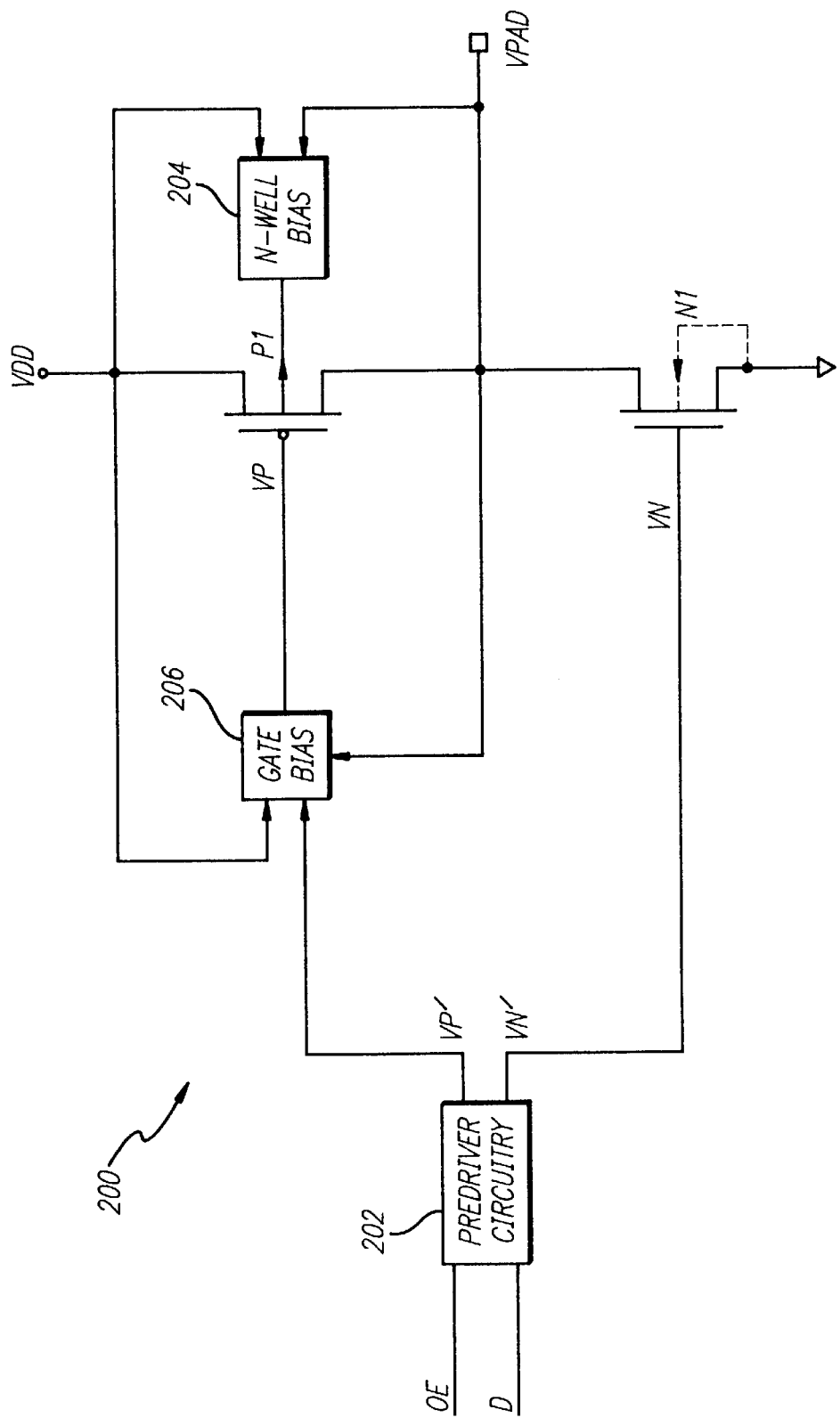
Figure 3A:
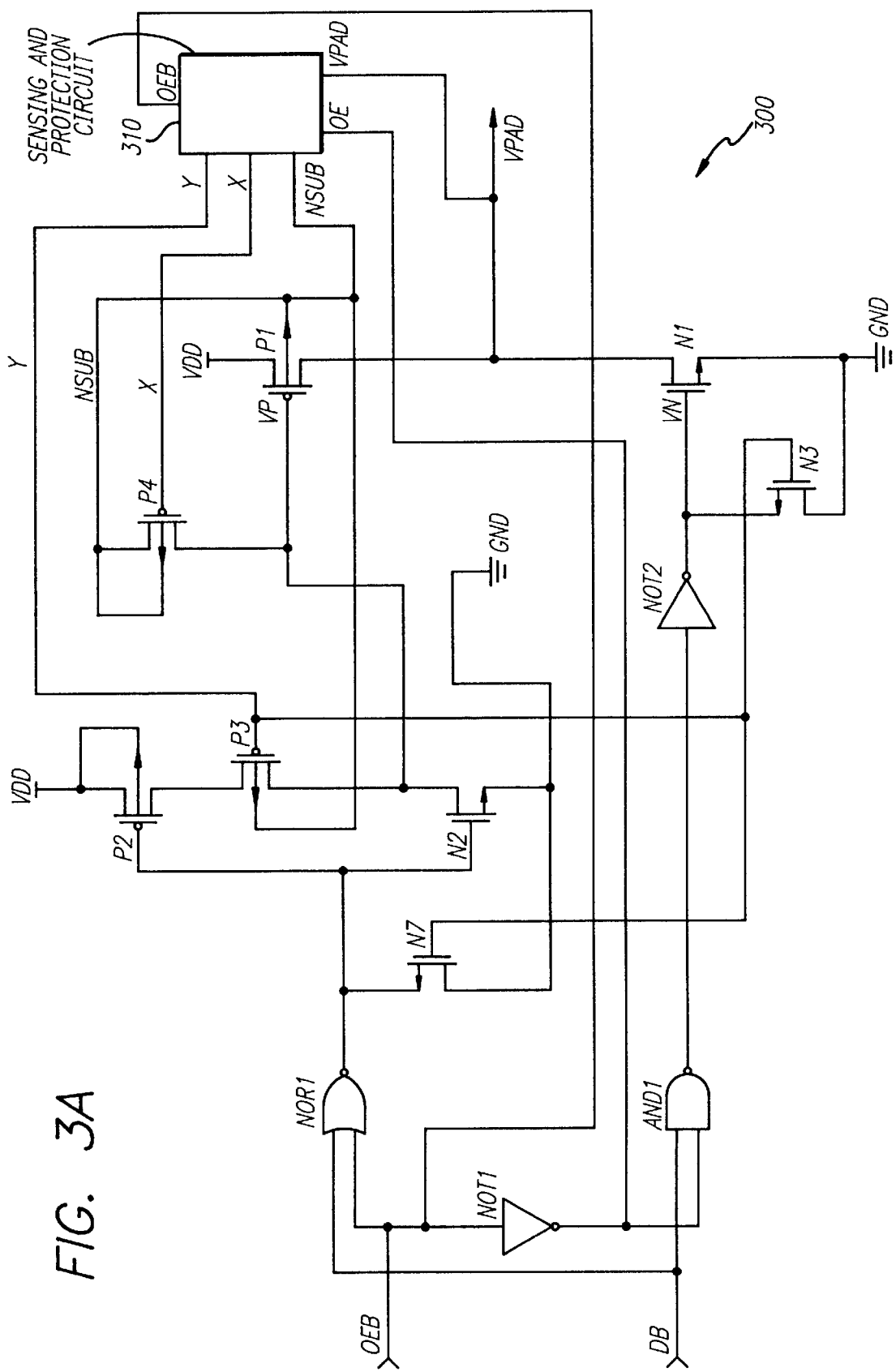
FIGS. 3A and 3B illustrate a stabilized, overvoltage tolerant CMOS tristate output buffer according to a first embodiment of the present invention.
Figure 3B:
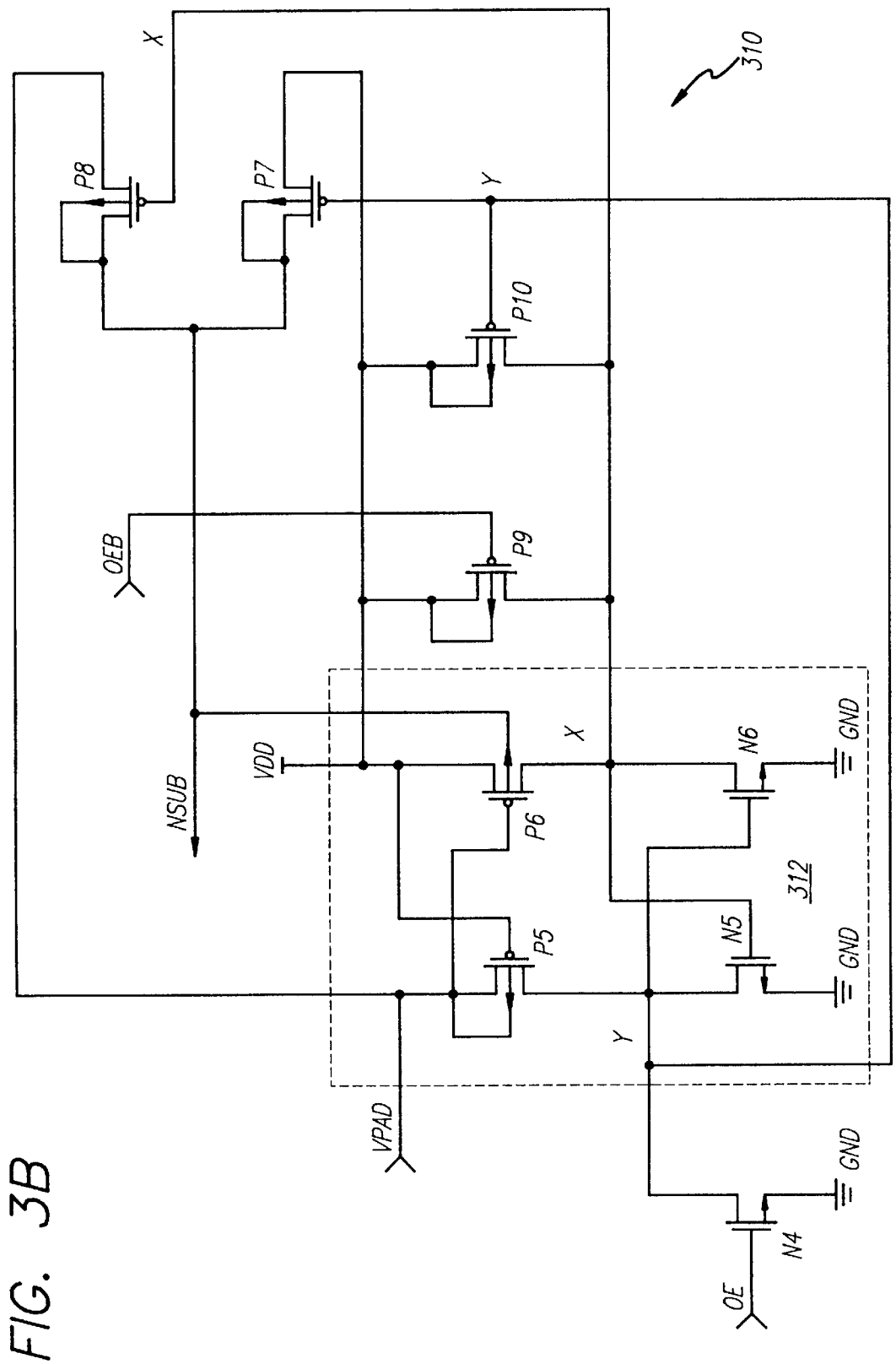

FIGS. 3A and 3B illustrate a stabilized, overvoltage tolerant CMOS tristate output buffer 300 according to a first embodiment of the present invention. Output buffer 300 comprises a P-channel driver transistor P1 having a source coupled to a node VDD, a drain coupled to a node VPAD, and a gate coupled to a node VP. Driver transistor P1 is formed in an N-well, which is generally referred to herein as a node NSUB, and has a backgate coupled to or integral with the N-well. Output buffer 300 further comprises an N-channel pulldown transistor N1 coupled between node VPAD and ground, with a gate coupled to a node VN.

Output buffer 300 further comprises a node OEB and a node DB for receiving input signals from low voltage CMOS core logic circuitry (not shown). The input signal received at node OEB is a complement of an output enable signal, while the input signal received at node DB is the complement of a data signal. Generally, as is known to one of ordinary skill in the art, the output enable signal, the data signal, and their complements may be considered to be available as inputs to the output buffer 300, whether or not these input nodes are actually shown in the drawings. For purposes of simplicity and clarity of disclosure, the terms OE, OEB, D, and DB will refer to the nodes themselves and/or their signal values interchangeably. In the present embodiment disclosed, the signal OEB is inverted by an inverter NOT1 to generate the signal OE.

Output buffer 300 further comprises a NOR gate NOR1 for receiving the signals at nodes OEB and DB and producing the Boolean NOR of these two logic signals. Output buffer 300 further comprises a P-channel predriver pullup transistor P2, a P-channel switch transistor P3, and an N-channel predriver pulldown transistor N2. Transistor P2 comprises a source coupled to VDD, a gate coupled to an output of NOR gate NOR1, and a drain. Transistor N2 comprises a drain coupled to the gate of driver transistor P1 at node VP, a source coupled to ground, and a gate coupled to the output of NOR gate NOR1. Switch transistor P3 is coupled between the drain of transistor P2 and the node VP. As will be described more fully later, transistor P3 is turned on during drive mode. Thus, the transistors P2 and N2 form a predriver stage for providing the appropriate driving voltage, together with sufficient driving current, to the gate of driver transistor P1 during drive mode.

Output buffer 300 further comprises an AND gate AND1 for receiving the signal OE, as generated by inverter NOT1, and the signal DB. AND gate AND1 has an output node coupled to the input of an inverter NOT2, which in turn has an output coupled to node VN. N-channel transistors N3 and N7, coupled as shown in FIG. 3A, are optional components for enhancing the grounding of node VN and the gate of transistor N2 when the voltage at node Y is driven high.

The combinational logic described above results in the following truth table:

TABLE 1

| OE | D | VP | VN | VPAD |
|---|---|---|---|---|
| low | low | high | low | HIGH IMPEDANCE |
| low | high | high | low | HIGH IMPEDANCE |
| high | high | low | low | high |
| high | low | high | high | low |

When OE is high, the output buffer 300 is in the drive mode. Thus, when OF is high and D is high, node VN is driven low to turn off pulldown transistor N1, while node VP is driven low to turn on driver transistor P1, causing VPAD to be driven high. When OE is high and D is low, the node VP is driven high to turn off driver transistor P1, while node VN is driven high to turn on pulldown transistor N1, thus causing VPAD to be driven to ground.

However, when OE is low, the output buffer 300 is in tristate mode, and the value of D does not matter. In this case, node VP is driven high to turn off driver transistor P1, and node VN is driven low to turn off pulldown transistor N1. Therefore, the node VPAD is isolated and the output buffer 300 represents a high impedance looking inward from the VPAD terminal.

The output buffer 300 further comprises a sensing and protection circuit 310, as shown in FIGS. 3A and 3B, to ensure that NSUB is driven to the voltage at node VPAD at the appropriate times to avoid reverse currents and latch-up in driver transistor P1. Sensing and protection circuit 310 comprises a sensing circuit 312, a clamping transistor N4, switch transistors P7 and P8, a clamping transistor P9, and a transistor P10.

Sensing circuit 312 comprises a P-channel transistor P5 coupled between node VPAD and a node Y having a gate coupled to node VDD. Sensing circuit 312 further comprises a P-channel transistor P6 coupled between VDD and a node X having a gate coupled to node VPAD. Sensing circuit 312 further comprises an N-channel transistor N5 coupled between node Y and ground having a gate coupled to node X. Finally, sensing circuit 312 comprises an N-channel transistor N6 coupled between node X and ground having a gate node coupled to node Y. Sensing circuit 312 is coupled at node Y to clamping transistor N4, and at node X to clamping transistor P9. Clamping transistor N4 is coupled between node Y and ground, and has a gate coupled to node OE. Clamping transistor P9 is coupled between node X and VDD, and has a gate coupled to node OEB. Sensing circuit 312 is also coupled at node Y to the gate of switch transistor P7, and coupled at node X to the gate of switch transistor P8.

Switch transistor P7 is coupled between the node VDD and the node NSUB. When switch transistor P7 is on, NSUB is thus effectively coupled to node VDD. Switch transistor P8 is coupled between the node VPAD and the node NSUB. When switch transistor P8 is on, NSUB is thus effectively coupled to node VPAD. Together, switch transistors P7 and P8 form a means for multiplexing the voltages at VDD and VPAD onto the node NSUB.

Sensing and protection circuit 310 further comprises P-channel transistor P10 coupled between node VDD and node X having a gate driven by node Y. The backgate of transistor P10 is connected to VDD.

Throughout the drive mode, when OE is high, nodes Y and X are clamped at ground and at VDD, respectively. More specifically, because OE is high, clamping transistor N4 clamps node Y to ground. Further, because OEB is low, clamping transistor P9 clamps node X to VDD. This turns transistor N6 off, and transistor N5 on. In turn, switch transistor P7 is turned on and switch transistor P8 is turned off, thus connecting node NSUB to VDD. This provides a sufficient biasing voltage to the N-well of driver transistor P1. Generally, voltages in the tristate output buffer 300 do not reach a value greater than VDD during drive mode.

As shown in FIG. 3A, tristate output buffer 300 further comprises a gate bias transistor P4 coupled between node NSUB and node VP having a gate coupled to node X. During drive mode, when node X is at VDD, gate bias transistor P4 is turned off and does not affect the voltage at node VP, which is being driven by predriver circuit P2 and N2 as described previously.

Also as shown in FIG. 3A, switch transistor P3 is driven at its gate by the signal at node Y. During drive mode, when node Y is low, switch transistor P3 is turned on and operates as a short between the drain of transistor P2 and node VP. Thus, during drive mode the transistors P2 and N2 form a predriver inverter for driving the gate of driver transistor P1.

During tristate mode, when OE is low, sensing and protection circuit 310 operates as follows. Clamping transistor N4 is turned off, and has minimal effect on the voltage at node Y. Further, clamping transistor P9 is turned off, and has minimal effect on the voltage at node X. Sensing circuit 312 is then driven by inputs VPAD and VDD at the sources of transistors P5 and P6, respectively. Two operating points can be easily understood: (1) when VPAD is significantly lower than VDD, and (2) when VPAD is significantly higher than VDD. In the first case, transistor P5 is turned off and transistor P6 is turned on. Transistor N5 is thus turned on and transistor N6 is turned off. Therefore, when VPAD is significantly lower than VDD, node Y is low and node X is at VDD, causing NSUB to be coupled to VDD through switch transistor P7.

In the second case, when VPAD is significantly higher than VDD, transistor P5 is turned on and transistor P6 is turned off. Transistor N5 is thus turned off and transistor N6 is turned on. Therefore, when VPAD is significantly lower than VDD, node Y is high (near VPAD) and node X is low, causing NSUB to be coupled to VPAD through switch transistor P8. This is the desired result, because where the voltage at node NSUB is substantially equal to the voltage at node VPAD, the diode formed between the drain of driver transistor P1 and the N-well is prevented from being forward biased.

Further to the second case when VPAD is significantly higher than VDD, gate bias transistor P4 is turned on because node X is low. This causes the gate of driver transistor P1 to be driven to the voltage at node NSUB, i.e., to substantially near VPAD, thus preventing reverse leakage current through driver transistor P1. This reduces gate oxide stresses as well. Also, because node Y is high, switch transistor P3 is turned off. This advantageously prevents undesired reverse leakage current from node VP to node VDD through transistor P2.

For situations not falling within (1) or (2) above, i.e., when VPAD is hovering at or near VDD during tristate mode, the unique configuration of the sensing circuit 312 and transistor P10 causes the signals at nodes X and Y to depend on the past value of VPAD as well as its present value, thus providing an input hysteresis characteristic to the sensing and protection circuit 310. This prevents circuit instability and overswitching of the switch transistors P7 and P8. The prevention of unnecessary switching of transistors P7 and P8 reduces heating, high-frequency noise, and other detrimental effects of over-switching.

Referring to FIGS. 3A and 3B, when VPAD rises progressively from 0.0 volts to 5.0 volts during tristate mode, node NSUB will be switched over from VDD to VPAD when VPAD is an upper switchover voltage equal to VDD plus an upper threshold voltage. Conversely, if VPAD then lowers progressively from 5.0 volts to 0.0 volts, node NSUB will be switched back over from VPAD to VDD when VPAD is at a lower switchover voltage equal to VDD minus a lower threshold voltage. In a typical embodiment of the invention, where VDD is equal to 3.3 volts, the upper and lower threshold voltages are each approximately 0.9 volts, causing the upper switchover voltage to be 4.2 volts and the lower switchover voltage to be 2.4 volts. Using design modifications which would be understood by one of ordinary skill in the art upon reading this disclosure, the parameters of various circuit transistors can be varied to achieve different upper and lower switchover voltages. For example, in another typical embodiment with VDD equal to 2.7 volts, the upper and lower switchover voltages are 3.8 volts and 2.3 volts, respectively.

Advantageously, the operation of sensing circuit 312, which in combination with transistor P10 may be called a "hysteresis latch," enhances circuit stability by causing the states of switch transistors P7 and P8 to remain steadfast when the voltage VPAD hovers in a range between the lower and upper switchover voltages during tristate mode. The state of the switch transistors P7 and P8 depends on the past value of VPAD before entering the range between the lower and upper switchover voltages: if VPAD came from above the upper switchover voltage into this range, switch transistor P7 remains off and switch transistor P8 remains on; if VPAD came from below the lower switchover voltage into this range, switch transistor P7 remains on and switch transistor P8 remains off.

Advantageously, it is noted that any transitions of the switch transistors P7 and P8 are "hard transitions," provided by "hard transitions" of X and Y from the "hysteresis latch," resulting in less transition current and heating in these comparatively large transistors. Overall, the effect is improved circuit stability.

In the embodiment shown in FIGS. 3A and 3B, the P-channel transistors P1–P10 are formed in a common N-well, denoted as node NSUB. Transistors P1, P3, P4, P6, P7, and P8 have backgate nodes connected to the N-well. Transistors P2, P5, P9, and P10 have backgate nodes coupled to node VDD.

Figures 1, 4:
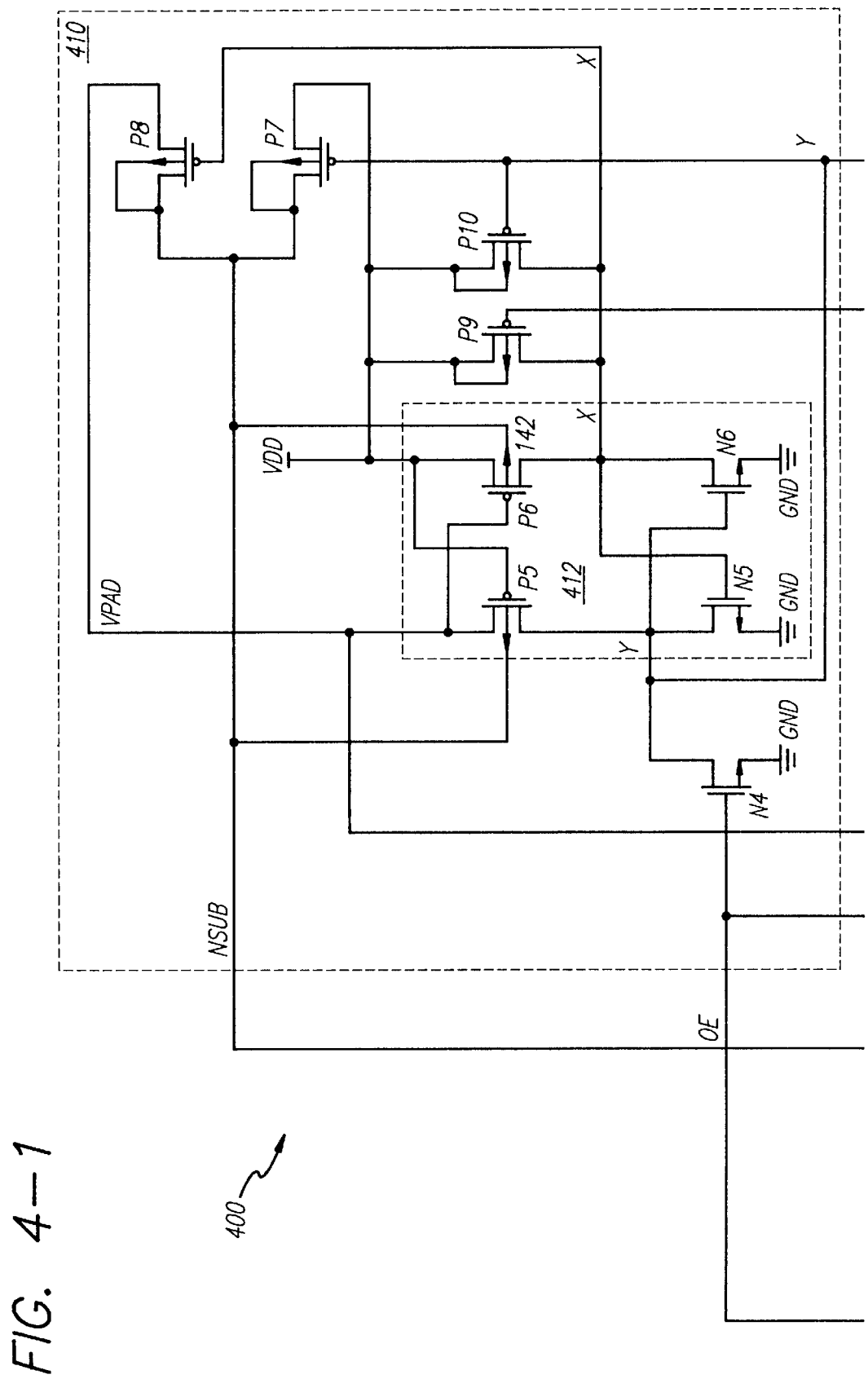
FIG. 4 illustrates a stabilized, overvoltage tolerant CMOS tristate output buffer according to a second embodiment of the present invention.
Figures 2, 4:
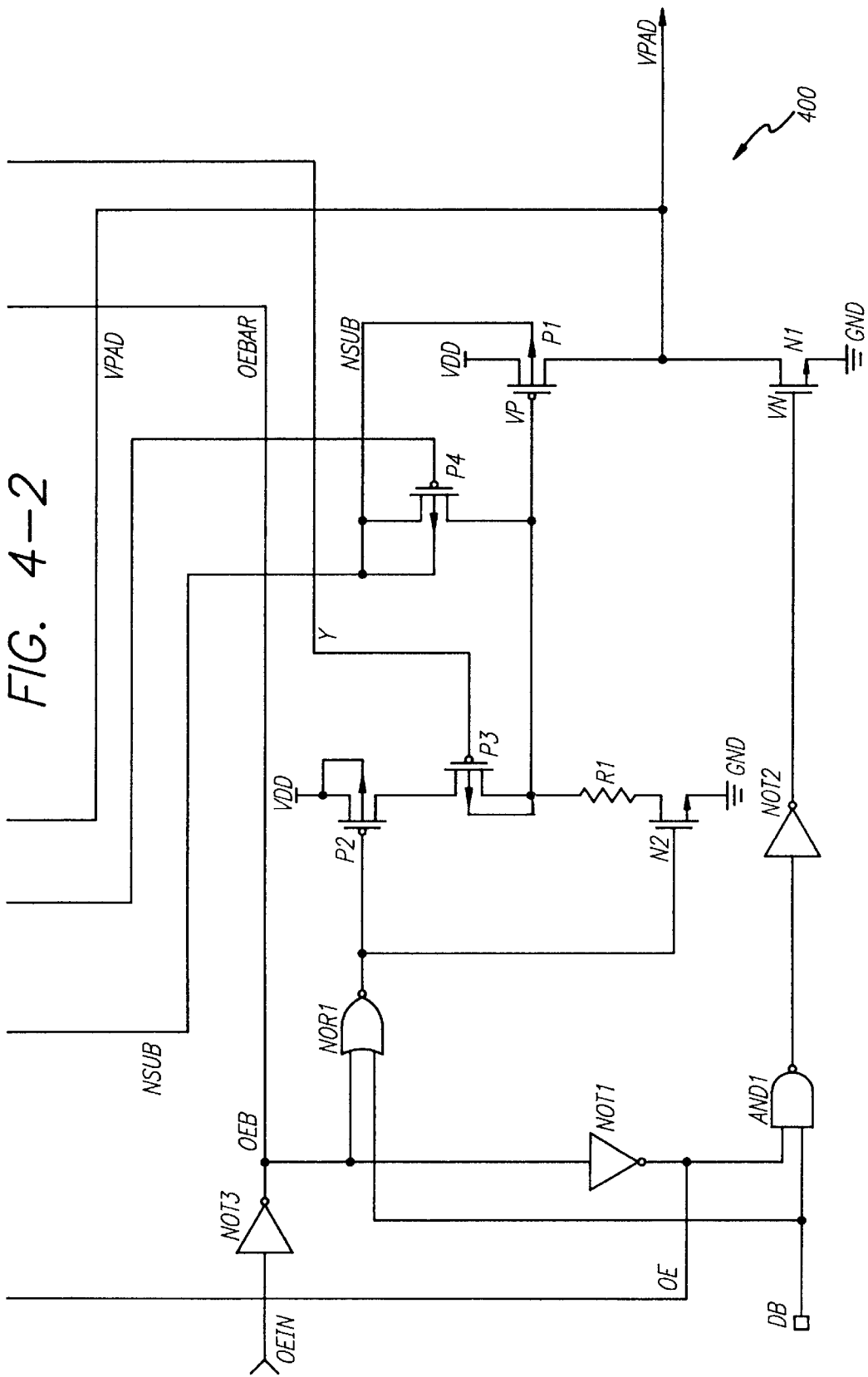

FIG. 4 illustrates a stabilized, overvoltage tolerant CMOS tristate output buffer 400 according to a second embodiment of the present invention. Output buffer 400 comprises elements including a sensing and protection circuit 410 which are similar to the elements of output buffer 300 of FIGS. 3A and 3B with certain modifications. Specifically, as shown in FIG. 4, the gate of gate bias transistor P4 is coupled directly to the node OE. This causes the node NSUB to be coupled to the gate of driver transistor P1 at node VP at all times during tristate mode, when OE is low. This direct coupling provides a timing advantage over the circuit of FIGS. 3A and 3B, causing node VP to follow NSUB without waiting for gate bias transistor P4 to turn on during tristate mode as VPAD rises above the upper switchover voltage. The direct coupling of node VP to node NSUB during tristate mode is enabled by the fact that node NSUB never goes low, and thus driver transistor P1 will always remain turned off during tristate mode.

Tristate buffer 400 according to the second embodiment of the present invention also differs from FIGS. 3A and 3B in that elements N3 and N7 are not included. Additionally, the backgate of switch transistor P3 is coupled to node VP instead of node NSUB, and the backgate of transistor P5 is coupled to node NSUB instead of node VPAD. Further, a node OEIN for providing an output enable signal input to an inverter NOT3 is included. The output of inverter NOT3 provides the OEB signal discussed previously with respect to the previous embodiment. Finally, a resistive element R1 is included between node VP and the drain of transistor N2. The resistive element R1 may comprise appropriately doped polysilicon. The value of resistance R1 is generally low, but can be varied using methods known in the art in order to adjust the timing of current being sunk through transistor N2. An exemplary value for R1 may be, for example, between 100 and 500 ohms.

Figure 5A:
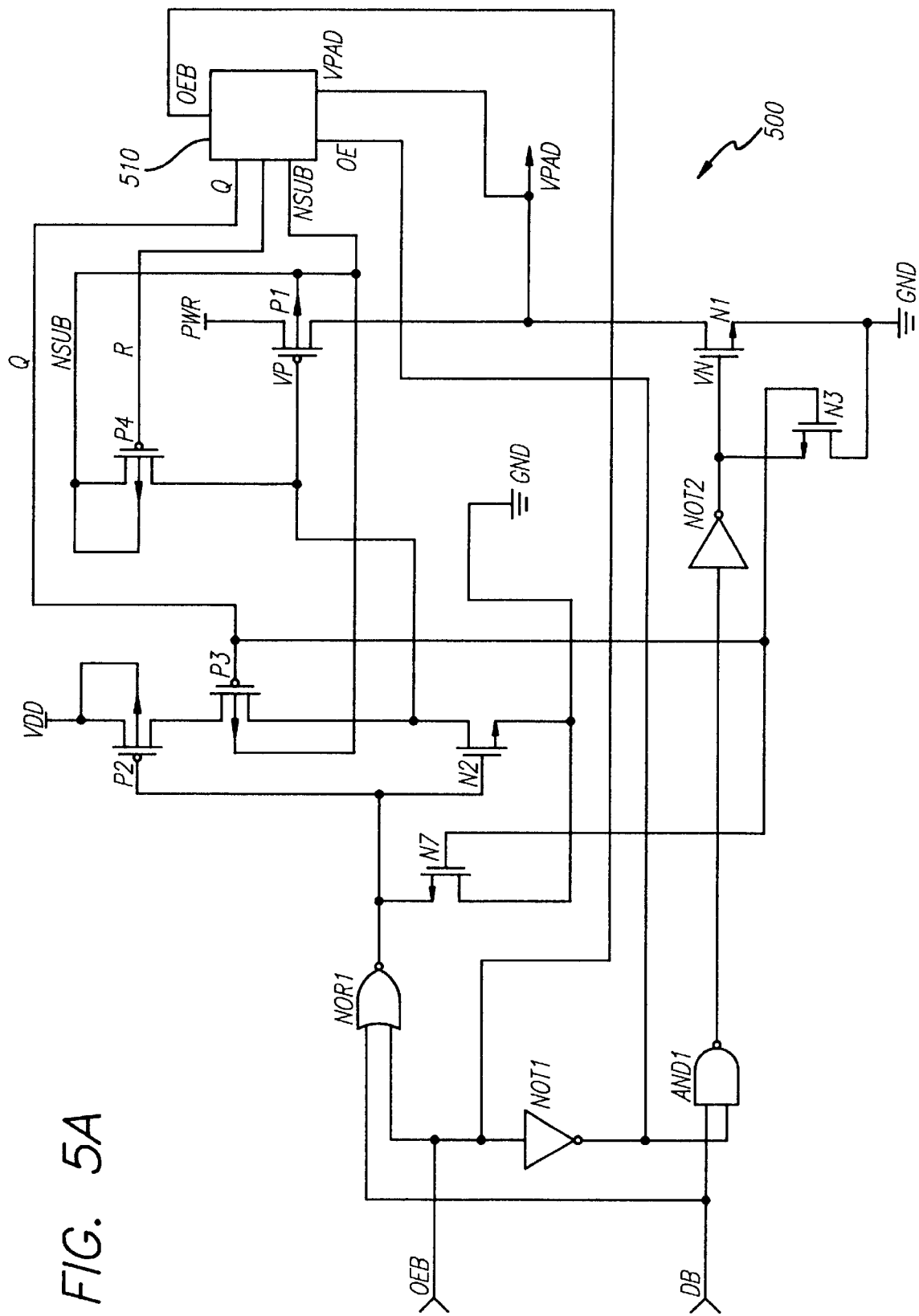
FIGS. 5A and 5B illustrate a stabilized, overvoltage tolerant CMOS tristate output buffer according to a third embodiment of the present invention.
Figure 5B:
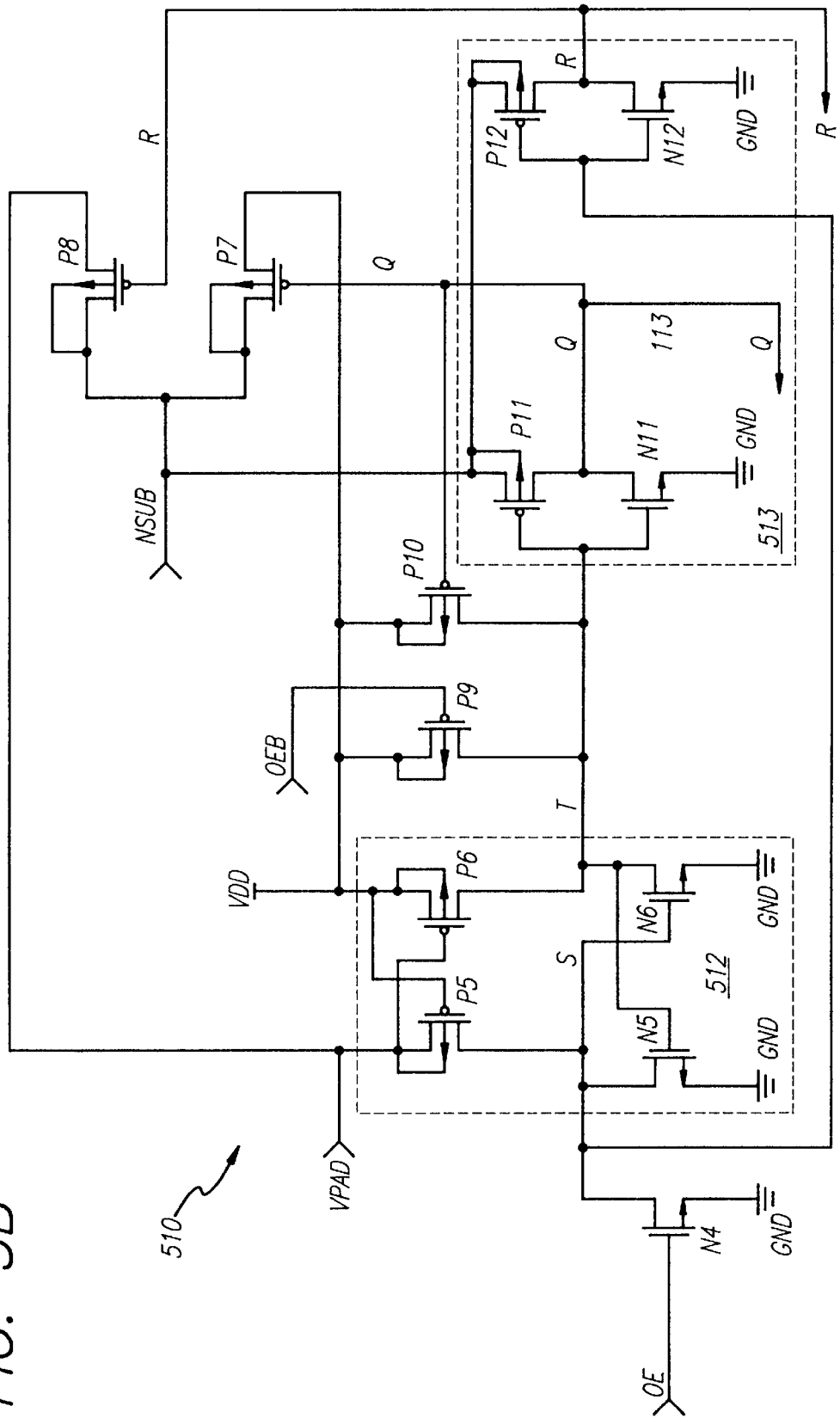

FIGS. 5A and 5B illustrate a stabilized, overvoltage tolerant CMOS tristate output buffer 500 according to a third embodiment of the present invention. Output buffer 500 comprises elements including a sensing and protection circuit 510 which are similar to the elements of output buffer 300 of FIGS. 3A and 3B with certain modifications. One modification is that the backgate of transistor P6 is coupled to node VDD instead of node NSUB as in FIG. 3A.

More importantly, however, sensing and protection circuit 510 includes a sensing circuit 512 coupled to switch transistors P7 and P8 by means of an amplifying circuit 513. Sensing circuit 512 comprises transistors P5, P6, N5, and N6 coupled to nodes VPAD and VDD and providing outputs at latch output nodes S and T. Nodes S and T are provided as inputs to amplifying circuit 513, which comprises output nodes Q and R for coupling to switch transistors P7 and P8, respectively.

Amplifying circuit 513 comprises a transistor P11 having a gate coupled to node T, a source coupled to node NSUB, and a drain coupled to node Q. Amplifying circuit 513 further comprises a transistor N11 having a gate coupled to node T, a source coupled to ground, and a drain coupled to node Q. Amplifying circuit 513 further comprises a transistor P12 having a gate coupled to node S, a source coupled to node NSUB, and a drain coupled to node R. Finally, amplifying circuit 513 comprises a transistor N12 having a gate coupled to node T, a source coupled to ground, and a drain coupled to node R. Switching transistors P7 and P8 can be relatively large and can require greater current to drive their gates relative to other P-channel transistors in the output buffer 500 (excepting, of course, driver transistor P1). Amplifying circuit 513 enhances the operation of sensing and protection circuit 510 by providing greater driving current to drive the gates of switch transistors P7 and P8 responsive to the outputs of sensing circuit 512.

As shown in FIG. 5A, the node Q is also coupled to the gate of switch transistor P3, while the node R is also coupled to the gate of gate bias transistor P4. During non-tristate mode, when OE is high and therefore node S is low, node T is high, node Q is low, and node R is high, switch transistor P3 will be turned on to allow transistors P2 and N2 to operate as a predriver circuit for driver transistor P1. Additionally, gate bias transistor P4 will be turned off and will not affect the voltage at node VP. This analysis also applies during tristate mode when node S is low and node T is high.

However, when the sensing circuit 512 drives node S high and node T low during tristate, node Q will be driven high and node R will be driven low. This causes the node NSUB to be connected to node VPAD through transistor P8. This also causes the gate bias transistor P4 to turn on responsive to the low state of node R, thus driving the voltage at node VP to the voltage at node NSUB to reduce reverse leakage current through P-channel driver transistor P1 and to reduce gate oxide stresses. Advantageously, switch transistor P3 is turned off by the high state of node Q, thus preventing leakage current from flowing from node VP to node VDD through transistor P2.

Figures 1, 6:
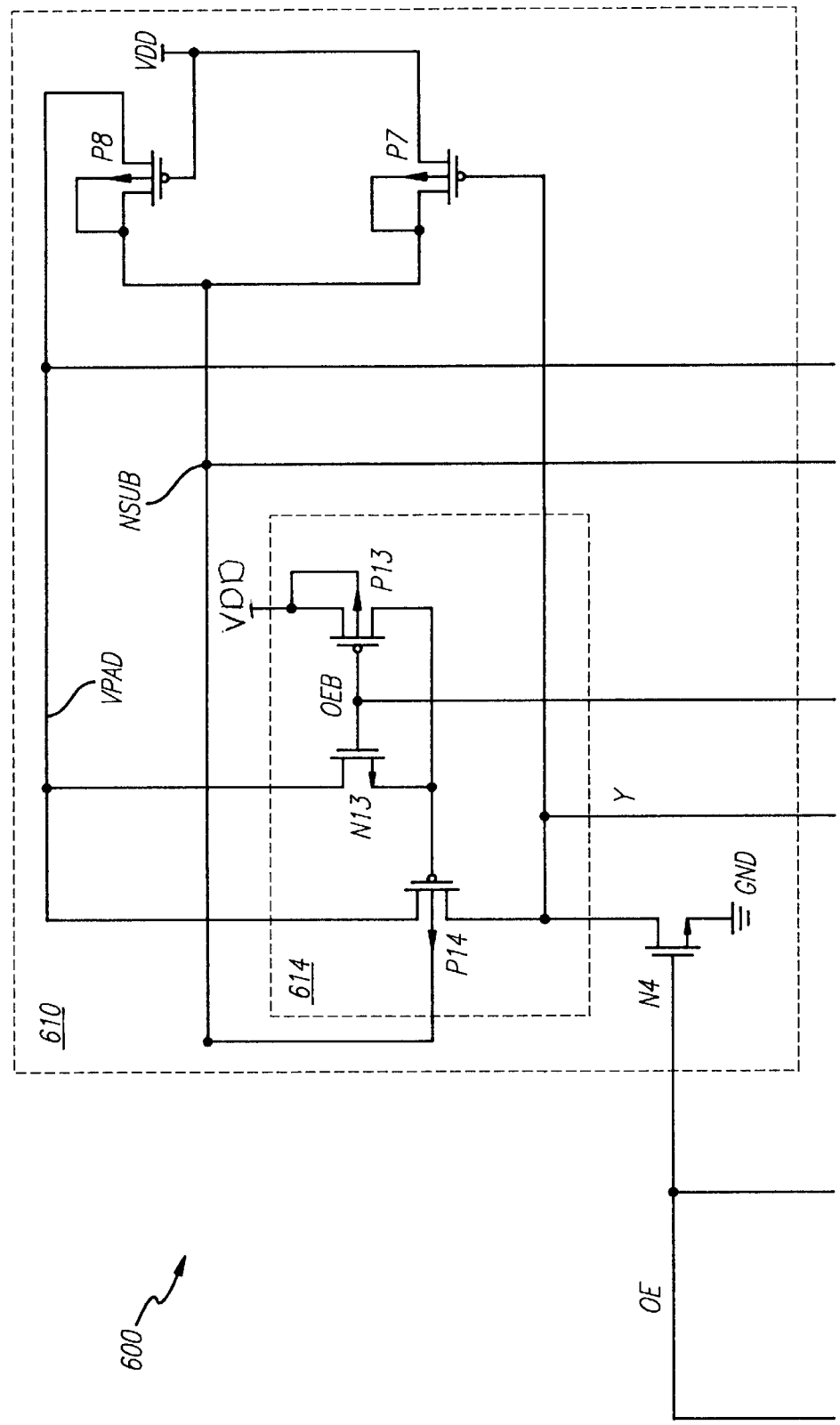
FIG. 6 illustrates an overvoltage tolerant CMOS tristate output buffer according to a fourth embodiment of the present invention.
Figures 2, 6:
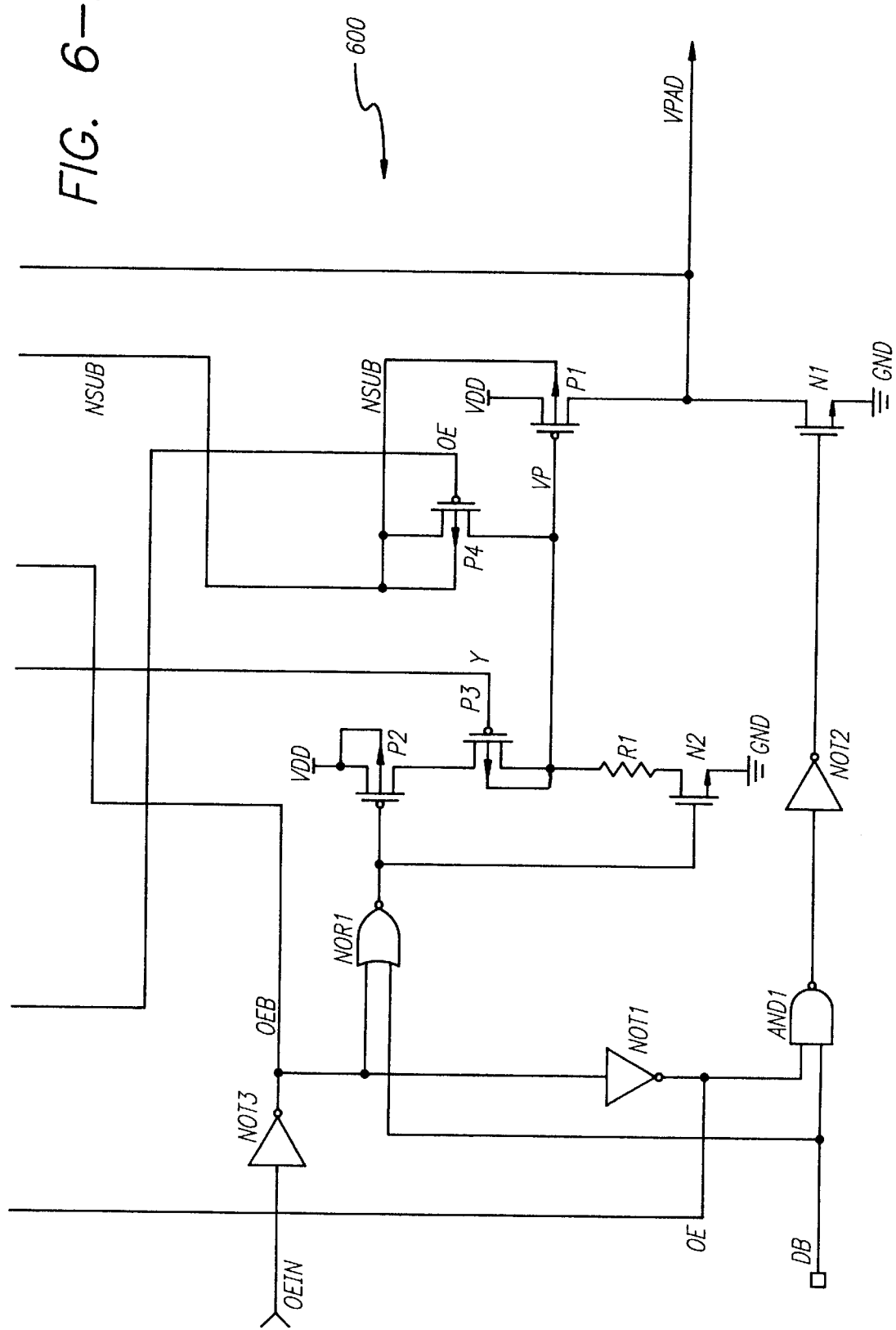

FIG. 6 illustrates an overvoltage tolerant CMOS tristate output buffer 600 according to a fourth embodiment of the present invention. Output buffer 600 of FIG. 6 is similar to the output buffer 400 of FIG. 4 except that a sensing and protection circuit 610 is provided which has a different structure than sensing and protection circuit 410 of FIG. 4. In particular, sensing and protection circuit 600 comprises transistors P7 and P8 which are not coupled in a multiplexing fashion, but rather the gate of transistor P8 is tied to VDD while the gate of transistor P7 is coupled to an output Y of an active-mode circuit 614.

Active-mode circuit 614 comprises a P-channel passgate transistor P14, an N-channel biasing transistor N13, and a P-channel biasing transistor P13. Biasing transistor N13 is connected between node VPAD and the gate of passgate transistor P14 and is driven at its gate by the signal OEB. Biasing transistor P13 is connected between node VDD and the gate of passgate transistor P14 and is also driven at its gate by the signal OEB. Passgate transistor P14 is coupled between node VPAD and node Y, and is driven at its gate by the output of biasing transistors N13 and P13. Active-mode circuit 614 further comprises an N-channel transistor coupled between node Y and ground and being driven by the signal OE. The signal Y is used to drive the gate of switch transistor P3, while the signal OE is used to drive the gate of gate bias transistor P4.

When output buffer 600 is in drive mode, OE is high and node Y is low. Accordingly, the sensing and protection circuit 610 allows gate bias transistor P4 to be off and transistor P3 to be on at all times during drive mode. This allows the gate VP of P-channel driver transistor P1 to be driven as dictated by the value of DB.

When output buffer 600 is in tristate mode, OE is low and node OEB is substantially equal to VDD. Without limiting the scope of the present invention and for clarity of disclosure, the exemplary case of VDD=3.3 volts will be described. Because node OEB is substantially equal to VDD=3.3 volts, the voltage at the gate of passgate transistor P14 is limited to VDD minus the threshold voltage of biasing transistor N1, or approximately 2.6 volts. When a voltage applied to VPAD exceeds 2.6 volts plus the threshold voltage of passgate transistor P14, or approximately 3.3 volts, the passgate transistor P14 is turned on to couple VPAD to the node Y. When the node Y is thus driven high, the transistor P7 is turned off and the transistor P3 is turned off. Concurrently, because transistor P8 has its gate coupled to VDD=3.3 volts, transistor P8 will be assisting in providing the value of VPAD>=3.3 volts to the node NSUB. Finally, because the gate bias transistor P4 is always on during tristate mode, the node VP is driven to the greater of VPAD or VDD as required.

Advantageously, the active mode circuit 614 of FIG. 6 provides a fast means for switching the switch transistor P3 responsive to the relative values of VPAD and VDD. In this manner, as VPAD rises above VDD during tristate mode, switch transistor P3 turns off in time to prevent reverse current from node VP to VDD through transistor P2.

It is to be noted that the value of resistance R1 is generally low, but can be varied using methods known in the art in order to adjust the timing of current being sunk through transistor N2. The timing of current being sunk through transistor N2 needs to be fast enough to turn P-channel driver transistor P1 on quickly, but without causing a current spike through transistor P1, which may cause unwanted inductive noise on the system bus to which the tristate output buffer 600 is connected. An exemplary value for R1 may be, for example, between 100 and 500 ohms.

Figures 1, 7:
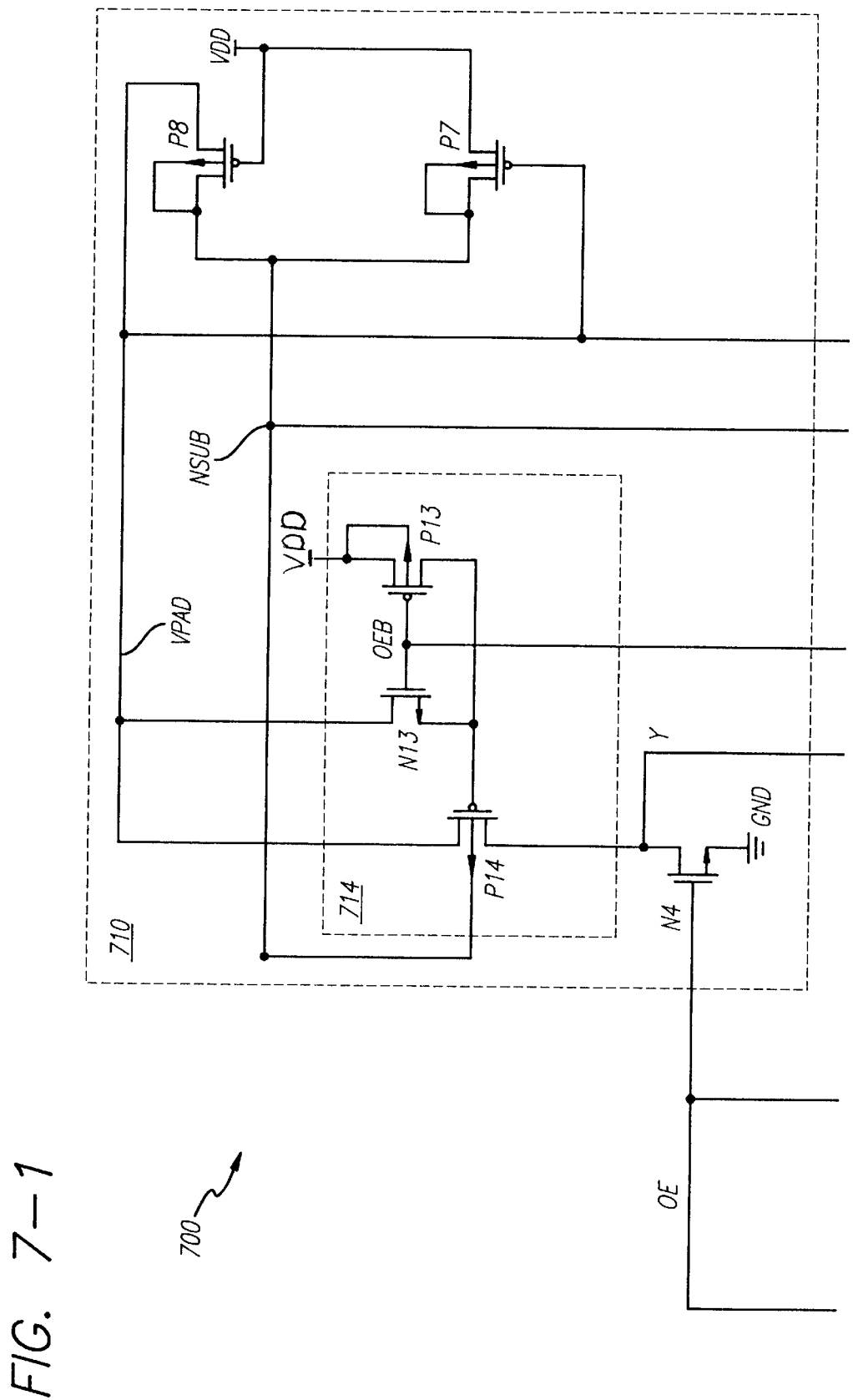
FIG. 7 illustrates an overvoltage tolerant CMOS tristate output buffer according to a fifth embodiment of the present invention.
Figures 2, 7:
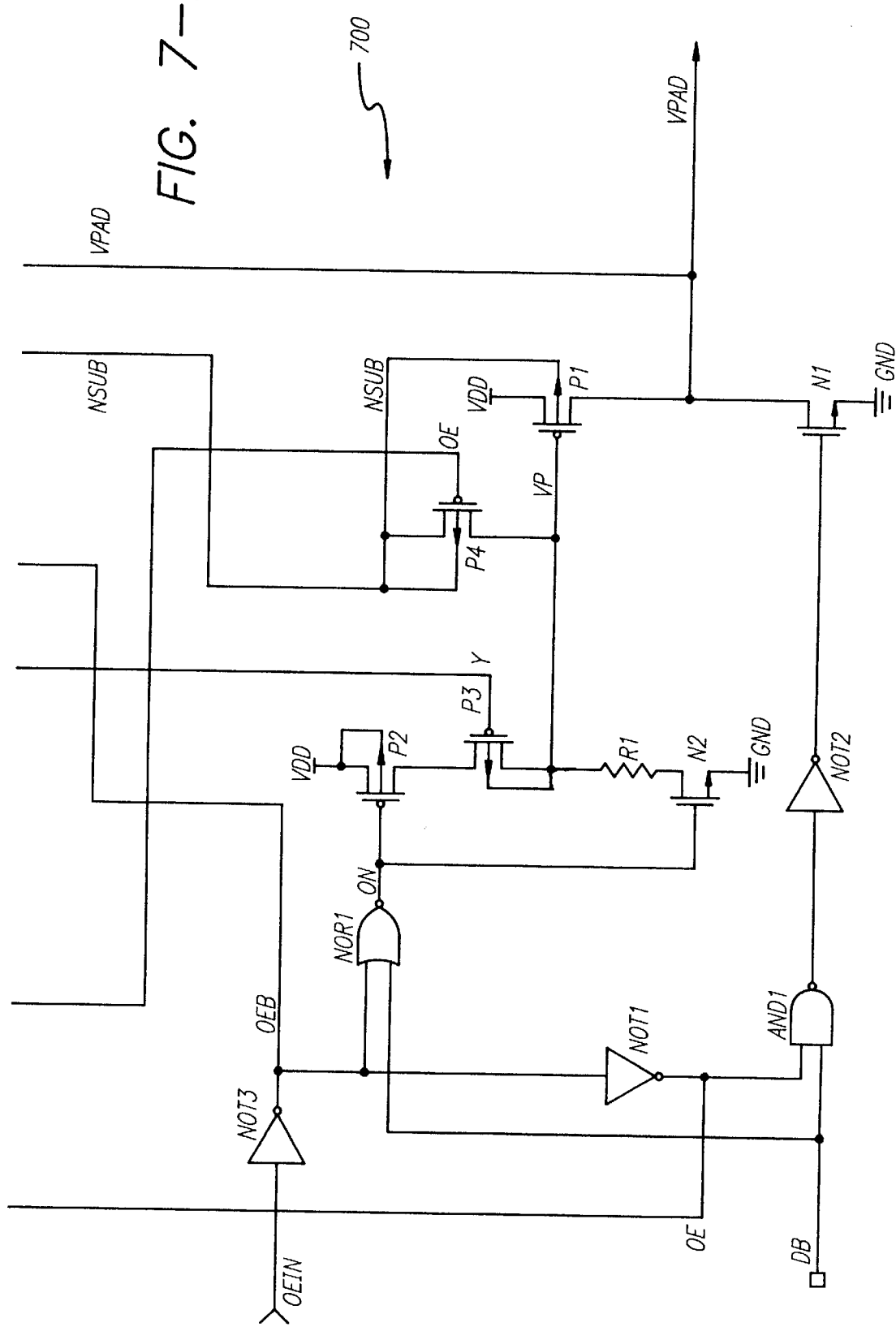

FIG. 7 illustrates an overvoltage tolerant CMOS tristate output buffer 700 according to a fifth embodiment of the present invention. Output buffer 700 of FIG. 7 is similar to the output buffer 600 of FIG. 6 except that a sensing and protection circuit 710 is provided which is a modified form of sensing and protection circuit 610. Sensing and protection circuit comprises an active mode circuit 714 similar in structure and operation to active mode circuit 614 and an N-channel transistor N4 similar in structure and operation to N-channel transistor N4 of FIG. 6. However, sensing and protection circuit 710 comprises a transistor P7 having its gate coupled directly to VPAD instead of to node Y. Thus, coupled as shown in FIG. 7, transistors P7 and P8 form a comparator circuit having the nodes VDD and VPAD as inputs and having the node NSUB as the output.

In operation, the output buffer 700 generates the signal at node Y in a manner similar to that of the output buffer 600 of FIG. 6. In particular, as VPAD rises above VDD during tristate mode, the active mode circuit 714 drives node Y high quickly enough to avoid reverse current from node VP to VDD through transistor P2.

Advantageously, however, the sensing and protection circuit 710 drives the voltage at node NSUB to the greater of VPAD or VDD at all times, and not only during tristate mode. This is because transistors P7 and P8, which are in a comparator arrangement, drive node NSUB in a manner which depends only on the values of VDD and VPAD, and not other system voltages such as the voltages at nodes OE or OEB. Such a characteristic may prove advantageous in preventing excessive oxide stress during an unforeseen occurrence such as a bus contention, when an external device may be attempting to drive VPAD to 5.0 volts even though the output buffer 700 is in drive mode. In this circumstance, the voltage at node NSUB will rise to the 5.0 volt level and excessive oxide stresses will be reduced.

It is apparent that many modifications and variations of the present invention as set forth here may be made without departing from the spirit and scope thereof. The specific embodiments described here and above are given by way of example only and the invention is limited only by the terms of the appended claims.

What is claimed is:

1. An output buffer, said output buffer having an output terminal for coupling to a bus, said output buffer having a first power supply node for coupling to a first power supply voltage, said output buffer also having a second power supply node for coupling to a second power supply voltage lower than said first power supply voltage, said output buffer having a drive mode and a high impedance mode, said output buffer driving said output terminal between substantially said first power supply voltage and said second power supply voltage in said drive mode, said output buffer having a high input impedance at said output terminal in said high impedance mode, said output terminal being driven at a bus voltage in said high impedance state, said bus voltage being capable of exceeding said first voltage, said output buffer comprising:

a P-channel driver transistor coupled between the first power supply node and said output terminal, said P-channel driver transistor being in an N-well;

a bias circuit, comprising:

a sensing circuit having a first state and a second state, said sensing circuit being coupled to the first power supply node and to the output terminal, said sensing circuit switching to said first state when said bus voltage goes below a lower switchover voltage less than the first power supply voltage, said sensing circuit switching to said second state when said bus voltage goes above an upper switchover voltage higher than the first power supply voltage, said sensing circuit comprising a first sensing circuit output node having a first logic value when said sensing circuit is in said first state and having a second logic value when said sensing circuit is in said second state, said sensing circuit further comprising a second sensing circuit output node having the second logic value when said sensing circuit is in said first state and having the first logic value when said sensing circuit is in said second state;

a switch circuit coupled to said N-well, said first power supply node, and said output terminal, said switch circuit for applying said first power supply voltage to said N-well responsive to said first state of said sensing circuit, said switch circuit for applying said bus voltage to said N-well responsive to said second state of said sensing circuit; and means for coupling said sensing circuit to said switch circuit, wherein said bias circuit has increased stability against bus voltage variations between the lower and upper switchover voltages.

2. The output buffer according to claim 1, said sensing circuit further comprising:

a first transistor coupled between said output terminal and said first sensing circuit output node, said first transistor having a control node coupled to said first power supply node;

a second transistor coupled between said first power supply node and said second sensing circuit output node, said second transistor having a control node coupled to said output terminal;

a third transistor coupled between said first sensing circuit output node and second power supply node, said third transistor having a control node coupled to said second sensing circuit output node; and a fourth transistor coupled between said second sensing circuit output node and second power supply node, said second transistor having a control node coupled to said first sensing circuit output node.

3. The output buffer according to claim 1, further comprising:

a drive enable node for receiving a drive enable signal, said drive enable signal being activated in said drive mode and deactivated in said high impedance mode;

a drive enable transistor coupled between said first sensing circuit output node and said second power supply node and having a control node coupled to said drive enable node.

4. The output buffer according to claim 1, said output buffer further comprising:

a drive enable complement node for receiving a complement of said drive enable signal; and a drive enable complement transistor coupled between said first power supply node and said second sensing circuit output node and having a control node coupled to said drive enable complement node.

5. The output buffer according to claim 1, said sensing circuit further comprising a transistor coupled between said first power supply node and said second sensing circuit output node and having a control node coupled to said first sensing circuit output node.

6. The output buffer according to claim 2, wherein said first and second transistors are P-channel transistors, and wherein said third and fourth transistors are N-channel transistors.

7. The output buffer according to claim 6, said first and second transistors each having a backgate, the backgate of said second transistor being coupled to said N-well.

8. The output buffer according to claim 1, said switch circuit comprising:

a first transistor coupled between said first power supply node and said N-well and having a control node, said first transistor being turned on in said first state of said sensing circuit and being turned off in said second state of said sensing circuit; and a second transistor coupled between said output terminal and said N-well and having a control node, said second transistor being turned on in said second state of said sensing circuit and being turned off in said first state of said sensing circuit.

9. The output buffer according to claim 8, said means for coupling comprising:

a first direct connection between said first sensing circuit output and said control node of said first transistor;

a second direct connection between said second sensing circuit output and said control node of said second transistor.

10. The output buffer according to claim 8, said means for coupling comprising an amplifying circuit for amplifying the signals at the first and second sensing circuit outputs.

11. The output buffer according to claim 10, said amplifying circuit being coupled to the N-well.

12. The output buffer according to claim 8, said first and second transistors having backgates, said backgates being coupled to said N-well.

13. The output buffer according to claim 1, said P-channel driver transistor having a gate, said output buffer further comprising a gate bias transistor coupled between said N-well and said gate of said P-channel driver transistor and having a control node, said gate bias transistor being turned on when said sensing circuit is in said second state.

14. The output buffer according to claim 13, said control node of said gate bias transistor being coupled to said second sensing circuit output.

15. The output buffer according to claim 13, said output buffer further comprising a drive enable node for receiving a drive enable signal, said drive enable signal being activated in said drive mode and deactivated in said high impedance mode, wherein said control node of said gate bias transistor is coupled to said drive enable node.

16. The output buffer according to claim 15, said output buffer further comprising:
   a predriver circuit for driving a voltage at said gate node of said P-channel driver transistor, said predriver circuit comprising:
      a P-channel predriver pullup transistor having a source coupled to said first power supply node, a gate, and a drain; and
      an N-channel predriver pulldown transistor coupled between said gate of said P-channel driver transistor and said second power supply and having a gate node coupled to said gate of said P-channel predriver pullup transistor.

17. The output buffer according to claim 16, said output buffer further comprising a predriver switch transistor coupled between said gate of said P-channel driver transistor and said drain of said P-channel predriver pullup transistor, said predriver switch transistor having a gate coupled to said first sensing circuit output, whereby reverse currents from said gate node of said P-channel driver transistor to said first power supply node through said P-channel predriver pullup transistor are prevented when said sensing circuit is in said second state.

18. The output buffer according to claim 15, said output buffer further comprising:
   a predriver circuit for driving a voltage at said gate node of said P-channel driver transistor, said predriver circuit comprising:
      a P-channel predriver pullup transistor having a source coupled to said first power supply node, a gate, and a drain; and
      an N-channel predriver pulldown transistor having a drain, a source coupled to said second power supply node, and a gate coupled to said gate of said P-channel predriver pullup transistor; and
      a resistor coupled between said gate of said P-channel driver transistor and said drain of said N-channel predriver pulldown transistor.

19. The output buffer according to claim 1, wherein said upper switchover voltage is more than 0.5 volts above the first power supply voltage, and wherein said lower switchover voltage is less than a voltage which is 0.5 volts below the first power supply voltage.

20. The output buffer according to claim 19, wherein said upper switchover voltage is near 4.2 volts, and wherein said lower switchover voltage is near 2.4 volts.

21. The output buffer according to claim 1, wherein said upper switchover voltage is near 3.8 volts, and wherein said lower switchover voltage is near 2.3 volts.

22. An output buffer, said output buffer having an output terminal for coupling to a bus, said output buffer having a first power supply node for coupling to a first power supply voltage, said output buffer also having a second power supply node for coupling to a second power supply voltage lower than said first power supply voltage, said output buffer having a drive mode and a high impedance mode, said output buffer driving said output terminal between substantially said first power supply voltage and said second power supply voltage in said drive mode, said output buffer having a high input impedance at said output terminal in said high impedance mode, said output terminal being driven at a bus voltage in said high impedance state, said bus voltage being capable of exceeding said first voltage, said output buffer comprising:

a P-channel driver transistor having a source coupled to the first power supply node and a drain coupled to said output terminal, said P-channel driver transistor being in an N-well;

an N-well bias circuit for biasing said N-well to a voltage sufficient to prevent forward biasing of said drain with respect to said N-well during said high impedance mode, said N-well bias circuit including a latch means, said latch means including a sensing circuit having a first state and a second state, said sensing circuit being coupled to the first power supply node and to the output terminal, said sensing circuit switching to said first state when said bus voltage goes below a lower switchover voltage less than the first power supply voltage, said sensing circuit switching to said second state when said bus voltage goes above an upper switchover voltage higher than the first power supply voltage, said N-well bias circuit further comprising:
   a switch circuit coupled to said N-well, said first power supply node, and said output terminal, said switch circuit for engaging said first power supply node to said N-well responsive to said first state of said sensing circuit, said switch circuit for engaging said output terminal to said N-well responsive to said second state of said sensing circuit; and
   means for coupling said latch means to said switch circuit;

whereby
   said N-well voltage is stabilized against bus voltage variations near said first power supply voltage during said high impedance mode.

23. The output buffer according to claim 22, said P-channel driver transistor having a gate, said output buffer further comprising a gate bias transistor coupled between said N-well and said gate of said P-channel driver transistor and having a control node, said gate bias transistor being turned on when said sensing circuit is in said second state.

24. The output buffer according to claim 23, said sensing circuit comprising:
   a first sensing circuit output node; and
   a second sensing circuit output node;
   wherein
   said first sensing circuit output node has a logic low value and said second sensing circuit output node has a logic high value when said sensing circuit is in said first state, and wherein said first sensing circuit output node has a logic high value and said second sensing circuit output node has a logic low value when said sensing circuit is in said second state.

25. The output buffer according to claim 24, wherein said control node of said gate bias transistor is coupled to said second sensing circuit output node.

26. The output buffer according to claim 24, said output buffer further comprising a drive enable node for receiving a drive enable signal, said drive enable signal being activated in said drive mode and deactivated in said high impedance mode, wherein said control node of said gate bias transistor is coupled to said drive enable node.

27. The output buffer according to claim 24, further comprising:
   a predriver circuit for driving the gate voltage of said P-channel driver transistor, said predriver circuit comprising:
      a P-channel predriver pullup transistor having a source coupled to said first power supply node, a drain, and a gate; and an N-channel predriver pulldown transistor having a source coupled to said second power supply node, a drain coupled to said gate of said P-channel driver transistor, and a gate coupled to said gate of said P-channel predriver pullup transistor;

a predriver switch transistor for preventing reverse current flow from said gate of said P-channel driver transistor to said first power supply node through said predriver pullup transistor, said predriver switch transistor being coupled between said drain of said predriver pullup transistor and said gate of said P-channel driver transistor, said predriver switch transistor having a gate coupled to said first sensing circuit output node.

28. The output buffer according to claim 23, said gate bias transistor having a backgate coupled to said N-well.

29. The output buffer according to claim 23, said predriver switch transistor having a backgate coupled to said gate of said P-channel driver transistor.

30. A CMOS tristate output buffer having an output terminal for coupling to a bus, a first power supply node for coupling to a first power supply voltage, a reference node for coupling to a reference voltage, said output buffer for driving said output terminal between said first power supply voltage and a reference voltage in a drive mode, said output buffer having a high input impedance at said output terminal in a tristate mode, said output buffer comprising:

a P-channel driver transistor coupled between the first power supply node and said output terminal, said P-channel driver transistor being in an N-well;

an N-well bias circuit coupled to said N-well, said first power supply node, and said output terminal for providing an N-well bias voltage to said N-well responsive to a voltage at said output terminal relative to said first power supply voltage, said N-well bias circuit having an input hysteresis characteristic for providing N-well bias circuit stability, said N-well bias circuit comprising:

a first transistor coupled between said first power supply node and said N-well and having a control node;

a second transistor coupled between said output terminal and said N-well and having a control node; and means for controlling said first and second transistors, wherein said first and second switch transistors are controlled responsive to both (a) a present output terminal voltage relative to said first power supply voltage, and (b) at least one past output terminal voltage for providing N-well bias circuit stability.

31. The CMOS tristate output buffer according to claim 30, said output terminal voltage having a value during tristate mode in one of a lower interval, intermediate interval, and upper interval, said lower interval being between said reference voltage and a lower switchover voltage less than said first power supply voltage, said intermediate interval being between said lower switchover voltage and an upper switchover voltage greater than said first power supply voltage, and said upper interval being greater than said upper switchover voltage, wherein said means for controlling controls said first and second transistors such that during tristate mode, (a) said N-well is coupled to said first power supply node when said output terminal voltage is in said lower interval;

(b) said N-well is coupled to said output terminal when said output terminal voltage is in said upper interval;

(c) said N-well is coupled to said first power supply node when said output terminal voltage is in said intermediate interval and was previously in said lower interval; and (d) said N-well is coupled to said output terminal when said output terminal voltage is in said intermediate interval and was previously in said upper interval.

32. The CMOS tristate output buffer according to claim 31, wherein during tristate mode:

(a) said first transistor is on and said second transistor is off when said output terminal voltage is in said lower interval;

(b) said first transistor is off and said second transistor is on when said output terminal voltage is in said upper interval;

(c) said first transistor is on and said second transistor is off when said output terminal voltage is in said intermediate interval and was previously in said lower interval; and (d) said first transistor is off and said second transistor is on when said output terminal voltage is in said intermediate interval and was previously in said upper interval.

33. The CMOS tristate output buffer according to claim 32, said means for controlling comprising:

a hysteresis latch coupled to said output terminal, and said first power supply node; and means for coupling said hysteresis latch to said first and second transistors.

34. The CMOS tristate output buffer according to claim 33, said hysteresis latch comprising:

a third transistor coupled between said output terminal and a first hysteresis latch output node, said third transistor having a control node coupled to said first power supply node;

a fourth transistor coupled between said first power supply node and a second hysteresis latch output node, said second P-channel transistor having a control node coupled to said output terminal;

a fifth transistor coupled between said first hysteresis latch output node and said reference voltage node, said fifth transistor having a control node coupled to said second hysteresis latch output node; and a sixth transistor coupled between said second hysteresis latch output node and said reference voltage node, said sixth transistor having a control node coupled to said first hysteresis latch output node.

35. The CMOS tristate output buffer according to claim 34, said hysteresis latch further comprising a seventh transistor coupled between said first power supply node and said second hysteresis circuit output node and having a control node coupled to said first hysteresis latch output node.

36. The CMOS tristate output buffer according to claim 35, said output buffer further comprising a drive enable complement node for receiving a complement of said drive enable signal, said N-well bias circuit further comprising an eighth transistor coupled between said first power supply node and said second hysteresis latch output node and having a control node coupled to said drive enable complement node.

37. The CMOS tristate output buffer according to claim 36, said means for coupling comprising:

a first direct connection between said first hysteresis circuit output node and said control node of said first transistor;

a second direct connection between said second hysteresis latch output node and said control node of said second transistor.

38. The CMOS tristate output buffer according to claim 37, said means for coupling comprising a first amplifying circuit coupled between said first hysteresis latch output node and said control node of said second transistor.

39. The CMOS tristate output buffer according to claim 38, said means for coupling further comprising a second amplifying circuit coupled between said second latch output and said control node of said first switch transistor.

40. The CMOS tristate output buffer according to claim 31, said P-channel driver transistor having a gate, further comprising a seventh transistor having a source coupled to the N-well, a drain coupled to the gate of the P-channel driver transistor, and a gate coupled to said second hysteresis latch output node.

41. The CMOS tristate output buffer according to claim 40, further comprising a predriver circuit for driving said gate of said P-channel driver transistor, said predriver circuit comprising:
   a P-channel pullup transistor having a source coupled to said first power supply node and having a gate and a drain;
   an N-channel pulldown transistor having a gate coupled to the gate of the P-channel pullup transistor, a source coupled to said reference voltage, and a drain coupled to the gate of said P-channel driver transistor; and
   a P-channel switch transistor coupled between said drain of said P-channel pullup transistor and said gate of said P-channel driver transistor and having a gate coupled to said first hysteresis latch output node.

42. The output buffer according to claim 31, wherein said upper switchover voltage is more than 0.5 volts above the first power supply voltage, and wherein said lower switchover voltage is less than a voltage which is 0.5 volts below the first power supply voltage.

43. The output buffer according to claim 42, wherein said upper switchover voltage is near 4.2 volts, and wherein said lower switchover voltage is near 2.4 volts.

44. The output buffer according to claim 31, wherein said upper switchover voltage is near 3.8 volts, and wherein said lower switchover voltage is near 2.3 volts.

45. A CMOS tristate output buffer having an output terminal for coupling to a bus, a first power supply node for coupling to a first power supply voltage, a reference node for coupling to a reference voltage, said output buffer for driving said output terminal between said first power supply voltage and a reference voltage in a drive mode, said output buffer having a high input impedance at said output terminal in a tristate mode, said output buffer comprising:
   a P-channel driver transistor coupled between the first power supply node and said output terminal, said P-channel driver transistor being in an N-well;
   an N-well bias circuit coupled to said N-well, said first power supply node, and said output terminal for providing an N-well bias voltage to said N-well responsive to a voltage at said output terminal relative to said first power supply voltage, said N-well bias circuit comprising a comparator;
   a gate bias circuit for coupling said N-well to a gate of said P-channel driver transistor during said tristate mode;
   a P-channel predriver transistor having a gate, a drain, and a source, said source being coupled to said first power supply node;
   an N-channel predriver transistor having gate coupled to said gate of said P-channel predriver transistor, a drain, and a source coupled to said reference node;
   a resistor coupled between said drain of said N-channel predriver transistor and a gate of said P-channel driver transistor;
   a P-channel switch transistor coupled between said drain of said P-channel driver transistor and said gate of said P-channel driver transistor and having a gate;
   means for driving said gate of said P-channel switch transistor such that said P-channel switch transistor is turned off when a voltage at said output terminal exceeds said first power supply voltage during tristate mode, said means for driving comprising a sensing circuit having a first state and a second state, said sensing circuit being coupled to the first power supply node and to the output terminal, said sensing circuit switching to said first state when said bus voltage goes below a lower switchover voltage less than the first power supply voltage, said sensing circuit switching to said second state when said bus voltage goes above an upper switchover voltage higher than the first power supply voltage;
   whereby
   reverse currents from said gate of said P-channel driver transistor to said first power supply node through said P-channel predriver transistor during tristate are prevented.

46. An output buffer, said output buffer having an output terminal for coupling to a bus, said output buffer having a first power supply node for coupling to a first power supply voltage, said output buffer also having a second power supply node for coupling to a second power supply voltage lower than said first power supply voltage, said output buffer having a drive mode and a high impedance mode, said output buffer driving said output terminal between substantially said first power supply voltage and said second power supply voltage in said drive mode, said output buffer having a high input impedance at said output terminal in said high impedance mode, said output terminal being driven at a bus voltage in said high impedance state, said bus voltage being capable of exceeding said first voltage, said output buffer comprising:
   a P-channel driver transistor coupled between the first power supply node and said output terminal, said P-channel driver transistor being in an N-well;
   a bias circuit, comprising:
      a sensing circuit having a first state and a second state, said sensing circuit being coupled to the first power supply node and to the output terminal, said sensing circuit switching to said first state when said bus voltage goes below a lower switchover voltage less than the first power supply voltage, said sensing circuit switching to said second state when said bus voltage goes above an upper switchover voltage higher than the first power supply voltage, said upper switchover voltage being more than 0.5 volts above the first power supply voltage, said lower switchover voltage being less than a voltage which is 0.5 volts below the first power supply voltage;
      a switch circuit coupled to said N-well, said first power supply node, and said output terminal, said switch circuit for applying said first power supply voltage to said N-well responsive to said first state of said sensing circuit, said switch circuit for applying said bus voltage to said N-well responsive to said second state of said sensing circuit; and
      means for coupling said sensing circuit to said switch circuit;
   wherein said bias circuit has increased stability against bus voltage variations between the lower and upper switchover voltages.

47. An output buffer, said output buffer having an output terminal for coupling to a bus, said output buffer having a first power supply node for coupling to a first power supply voltage, said output buffer also having a second power supply node for coupling to a second power supply voltage lower than said first power supply voltage, said output buffer having a drive mode and a high impedance mode, said output buffer driving said output terminal between substantially said first power supply voltage and said second power supply voltage in said drive mode, said output buffer having a high input impedance at said output terminal in said high impedance mode, said output terminal being driven at a bus voltage in said high impedance state, said bus voltage being capable of exceeding said first voltage, said output buffer comprising:

- a P-channel driver transistor coupled between the first power supply node and said output terminal, said P-channel driver transistor being in an N-well;
- a bias circuit, comprising:
  - a sensing circuit having a first state and a second state, said sensing circuit being coupled to the first power supply node and to the output terminal, said sensing circuit switching to said first state when said bus voltage goes below a lower switchover voltage less than the first power supply voltage, said sensing circuit switching to said second state when said bus voltage goes above an upper switchover voltage higher than the first power supply voltage, said upper switchover voltage being near 3.8 volts, said lower switchover voltage being near 2.3 volts;
  - a switch circuit coupled to said N-well, said first power supply node, and said output terminal, said switch circuit for applying said first power supply voltage to said N-well responsive to said first state of said sensing circuit, said switch circuit for applying said bus voltage to said N-well responsive to said second state of said sensing circuit; and
  - means for coupling said sensing circuit to said switch circuit;
- wherein said bias circuit has increased stability against bus voltage variations between the lower and upper switchover voltages.

48. An output buffer, said output buffer having an output terminal for coupling to a bus, said output buffer having a first power supply node for coupling to a first power supply voltage, said output buffer also having a second power supply node for coupling to a second power supply voltage lower than said first power supply voltage, said output buffer having a drive mode and a high impedance mode, said output buffer driving said output terminal between substantially said first power supply voltage and said second power supply voltage in said drive mode, said output buffer having a high input impedance at said output terminal in said high impedance mode, said output terminal being driven at a bus voltage in said high impedance state, said bus voltage being capable of exceeding said first voltage, said output buffer comprising:

- a P-channel driver transistor coupled between the first power supply node and said output terminal, said P-channel driver transistor being in an N-well;
- a bias circuit, comprising:
  - a sensing circuit having a first state and a second state, said sensing circuit being coupled to the first power supply node and to the output terminal, said sensing circuit switching to said first state when said bus voltage goes below a lower switchover voltage less than the first power supply voltage, said sensing circuit switching to said second state when said bus voltage goes above an upper switchover voltage higher than the first power supply voltage;
  - a switch circuit coupled to said N-well, said first power supply node, and said output terminal, said switch circuit for applying said first power supply voltage to said N-well responsive to said first state of said sensing circuit, said switch circuit for applying said bus voltage to said N-well responsive to said second state of said sensing circuit;
  - said switch circuit comprising:
    - a first transistor coupled between said first power supply node and said N-well and having a control node, said first transistor being turned on in said first state of said sensing circuit and being turned off in said second state of said sensing circuit;
    - a second transistor coupled between said output terminal and said N-well and having a control node, said second transistor being turned on in said second state of said sensing circuit and being turned off in said first state of said sensing circuit; and
    - means for coupling said sensing circuit to said switch circuit;
- wherein said bias circuit has increased stability against bus voltage variations between the lower and upper switchover voltages.

49. An output buffer, said output buffer having an output terminal for coupling to a bus, said output buffer having a first power supply node for coupling to a first power supply voltage, said output buffer also having a second power supply node for coupling to a second power supply voltage lower than said first power supply voltage, said output buffer having a drive mode and a high impedance mode, said output buffer driving said output terminal between substantially said first power supply voltage and said second power supply voltage in said drive mode, said output buffer having a high input impedance at said output terminal in said high impedance mode, said output terminal being driven at a bus voltage in said high impedance state, said bus voltage being capable of exceeding said first voltage, said output buffer comprising:

- a P-channel driver transistor having a source coupled to the first power supply node and a drain coupled to said output terminal, said P-channel driver transistor being in an N-well;
- an N-well bias circuit for biasing said N-well to a voltage sufficient to prevent forward biasing of said drain with respect to said N-well during said high impedance mode, said N-well bias circuit comprising:
  - a latch means;
  - a switch circuit coupled to said N-well, said first power supply node, and said output terminal, said switch circuit for engaging said first power supply node to said N-well responsive to a first state of a sensing circuit, said switch circuit for engaging said output terminal to said N-well responsive to a second state of a sensing circuit; and
  - means for coupling said latch means to said switch circuit;
- whereby said N-well voltage is stabilized against bus voltage variations near said first power supply voltage during said high impedance mode.

* * * * *